United States Patent
Kobayashi et al.

(10) Patent No.: US 9,716,009 B2
(45) Date of Patent: Jul. 25, 2017

(54) POWER SEMICONDUCTOR DEVICE WITH ELECTRODE HAVING TRENCH STRUCTURE

(71) Applicant: Kabushiki Kaisha Toshiba, Minato-ku, Tokyo (JP)

(72) Inventors: Kenya Kobayashi, Nonoichi Ishikawa (JP); Toshifumi Nishiguchi, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/639,520

(22) Filed: Mar. 5, 2015

(65) Prior Publication Data

US 2016/0093719 A1    Mar. 31, 2016

(30) Foreign Application Priority Data

Sep. 30, 2014   (JP) ................................ 2014-201645

(51) Int. Cl.
*H01L 29/76*   (2006.01)
*H01L 21/28*   (2006.01)
(Continued)

(52) U.S. Cl.
CPC ...... *H01L 21/28008* (2013.01); *H01L 29/407* (2013.01); *H01L 29/42368* (2013.01); *H01L 29/66734* (2013.01); *H01L 29/7813* (2013.01)

(58) Field of Classification Search
CPC ........... H01L 21/28008; H01L 29/7827; H01L 29/407; H01L 29/4236; H01L 29/66666
(Continued)

(56) References Cited

U.S. PATENT DOCUMENTS 5,637,898 A   6/1997   Baliga
5,998,833 A   12/1999  Baliga
(Continued)

FOREIGN PATENT DOCUMENTS

JP   4178789 B2       11/2008
JP   2013-065774 A    4/2013
JP   2013-153053 A    8/2013

OTHER PUBLICATIONS

Yu Chen et al., Design of Gradient Oxide-Bypassed Superjunction Power MOSFET Devices, IEEE Trans. On Power Electronics, vol. 22, No. 4, pp. 1303-1310 (Jul. 2007).
(Continued)

*Primary Examiner* — Hung Vu
(74) *Attorney, Agent, or Firm* — White & Case LLP

(57) ABSTRACT

According to one embodiment, a semiconductor device includes: a first semiconductor region; a second semiconductor region selectively provided on the first semiconductor region; a third semiconductor region selectively provided on the second semiconductor region; a first electrode provided on the third semiconductor region and connected to the third semiconductor region; a second electrode electrically connected to the first semiconductor region; a third electrode provide via an insulating film on the first semiconductor region, the second semiconductor region, and the third semiconductor region; and a fourth electrode provided on the second electrode side of the third electrode, the fourth electrode being provided via the insulating film on the first semiconductor region. The insulating film has three or more regions between the fourth electrode and the first semiconductor region. Width of each of the regions in a direction crossing a direction from the third electrode toward the second electrode is different.

5 Claims, 27 Drawing Sheets

(51) Int. Cl.
  *H01L 29/40* (2006.01)
  *H01L 29/423* (2006.01)
  *H01L 29/66* (2006.01)
  *H01L 29/78* (2006.01)
(58) Field of Classification Search
  USPC .......................................... 257/330–333, 340
  See application file for complete search history.

(56) References Cited

U.S. PATENT DOCUMENTS

| | | | |
|---|---|---|---|
| 6,787,847 | B2 | 9/2004 | Disney |
| 8,198,678 | B2 | 6/2012 | Mauder et al. |
| 8,502,315 | B2 | 8/2013 | Mauder et al. |
| 8,741,736 | B2 | 6/2014 | Mauder et al. |
| 2011/0133272 | A1 | 6/2011 | Mauder et al. |
| 2011/0215399 | A1 | 9/2011 | Matsuura et al. |
| 2012/0217580 | A1 | 8/2012 | Mauder et al. |
| 2012/0241854 | A1* | 9/2012 | Ohta ............ H01L 29/0856 257/331 |
| 2012/0326227 | A1* | 12/2012 | Burke ............ H01L 29/407 257/330 |
| 2013/0069150 | A1 | 3/2013 | Matsuoka et al. |
| 2013/0153995 | A1 | 6/2013 | Misawa et al. |
| 2013/0248987 | A1 | 9/2013 | Okuhata |
| 2013/0323897 | A1 | 12/2013 | Mauder et al. |
| 2014/0030868 | A1* | 1/2014 | Parthasarathy ...... H01L 29/407 438/430 |
| 2014/0054682 | A1* | 2/2014 | Padmanabhan ....... H01L 29/404 257/330 |

OTHER PUBLICATIONS

Ying Wang et al., "Gate Enhanced Power UMOSFET With Ultralow On-Resistance," IEEE Electron Device Letters, vol. 31, No. 4, pp. 338-340 (Apr. 2010).

Y. Baba et al., "A Study on a High Blocking Voltage UMOS-FET With a Double Gate Structure," in Proceedings of ISPSD'92, pp. 300-302 (1992).

Masahito Kodama et al., "Temperature characteristics of a new 100V rated power MSFET, VLMOS (Vertical LOCOS MOS)," in Proceedings of ISPSD'04, pp. 463-466 (2004).

G.E.J. Koops et al., "Resurf Stepped Oxide (RSO) MOSFET for 85V having a record-low specific on-resistance," in Proceedings of ISPSD'04, pp. 185-188 (2004).

M.A. Gajda et al., "Industrialisation of Resurf Stepped Oxide Technology for Power Transistors," in Proceedings of ISPDS'06, pp. 109-112 (2006).

P. Goarin et al., "Split-gate Resurf Stepped Oxide (RSO) MOSFETs for 25 V applications with record low gate-to-drain charge," in Proceedings of ISPSD'07, pp. 61-64 (2007).

K. Kobayashi et al., "An 18V n-channel UMOSFET with super low on-resistance by using vertical result structure," in the Papers of Joint Technical Meeting, IEE Japan, EDD-12-068, SPC-12-141, pp. 49-53 (2012).

* cited by examiner

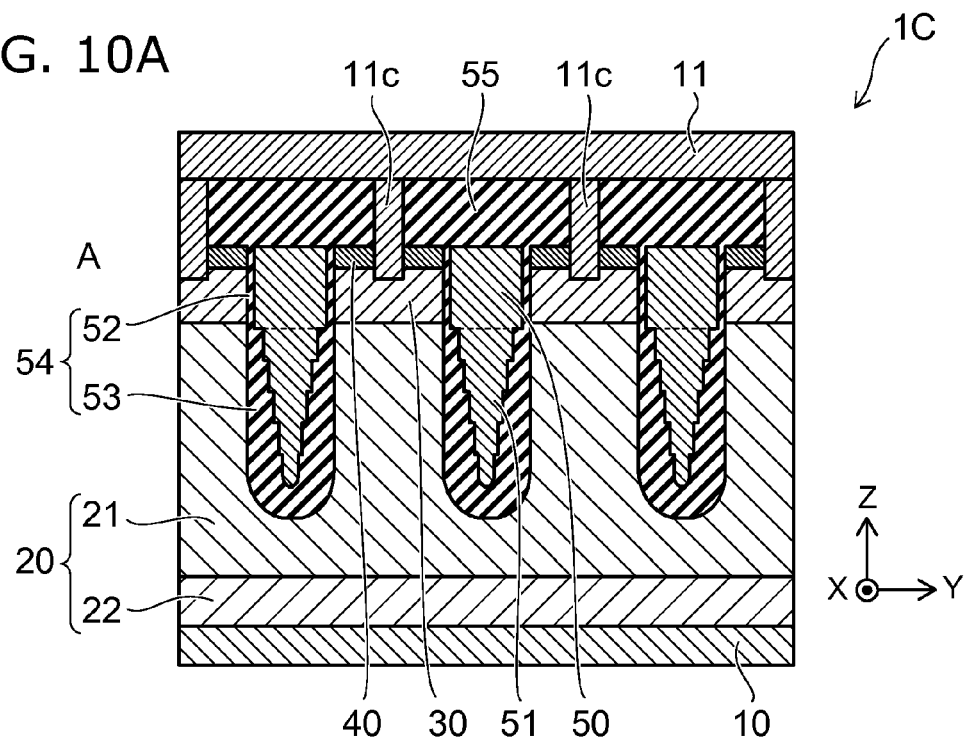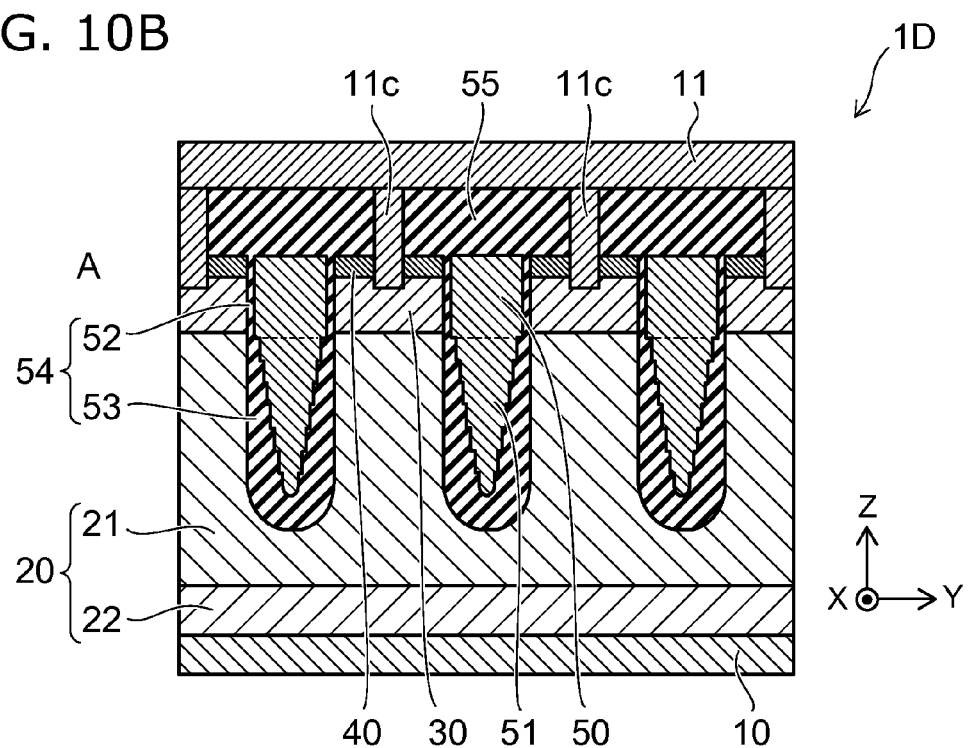

POWER SEMICONDUCTOR DEVICE WITH ELECTRODE HAVING TRENCH STRUCTURE

CROSS-REFERENCE TO RELATED APPLICATIONS

This application is based upon and claims the benefit of priority from Japanese Patent Application No. 2014-201645, filed on Sep. 30, 2014; the entire contents of which are incorporated herein by reference.

FIELD

Embodiments described herein relate generally to a semiconductor device and a method for manufacturing the same.

BACKGROUND

In a semiconductor device such as a MOSFET (metal oxide semiconductor field effect transistor) of the field plate structure, a field plate electrode is provided below a gate electrode. The field plate electrode thus provided relaxes electric field intensity in the drift region of the MOSFET. This improves the drain-source breakdown voltage of the MOSFET. Furthermore, with the improvement of breakdown voltage, the impurity concentration of the drift region can be set higher. This can reduce the on-resistance of the MOSFET. That is, the MOSFET of the field plate structure can improve the tradeoff between the improvement of breakdown voltage and the reduction of on-resistance in the MOSFET.

However, in an actual MOSFET of this type, the electric field concentrates near the p-n junction between the base region and the drift region or the lower end of the field plate electrode. This may hamper the achievement of sufficient breakdown voltage. A better tradeoff is desired between the improvement of breakdown voltage and the reduction of on-resistance in the MOSFET of the field plate structure.

BRIEF DESCRIPTION OF THE DRAWINGS

FIG. 1A is a schematic sectional view taken along line B-B' of FIG. 1B, FIG. 1B is a schematic plan view taken along line A-A' of FIG. 1A;

FIGS. 10A and 10B show schematic sectional views of the substantial part of a semiconductor device according to variations of the first embodiment;

DETAILED DESCRIPTION

Figure 1A:
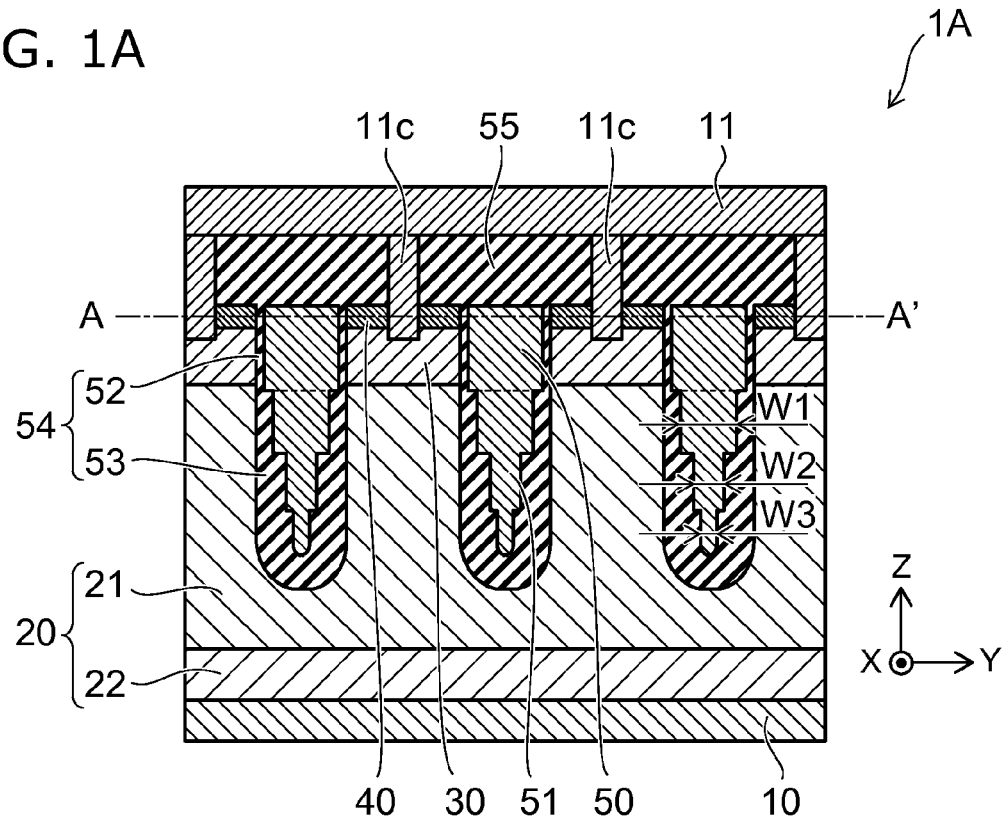
FIG. 1A shows a substantial part sectional view of a semiconductor device according to a first embodiment.

In general, according to one embodiment, a semiconductor device includes: a first semiconductor region of a first conductivity type; a second semiconductor region of a second conductivity type selectively provided on the first semiconductor region; a third semiconductor region of the first conductivity type selectively provided on the second semiconductor region; a first electrode provided on the third semiconductor region and the first electrode electrically being connected to the third semiconductor region; a second electrode electrically connected to the first semiconductor region; a third electrode provide via an insulating film on the first semiconductor region, the second semiconductor region, and the third semiconductor region; and a fourth electrode provided on the second electrode side of the third electrode, the fourth electrode being provided via the insulating film on the first semiconductor region.

The insulating has three or more regions film between the fourth electrode and the first semiconductor region. Width of each of the regions in a direction crossing a direction from the third electrode toward the second electrode is different.

Embodiments will now be described with reference to the drawings. In the following description, like members are labeled with like reference numerals, and the description of the members once described is omitted appropriately. In the embodiments, unless otherwise specified, $n^+$-type and n-type indicate that the impurity concentration of n-type (first conductivity type) decreases in this order. Likewise, $p^+$-type and p-type indicate that the impurity concentration of p-type (second conductivity type) decreases in this order.

First Embodiment

Figure 1B:
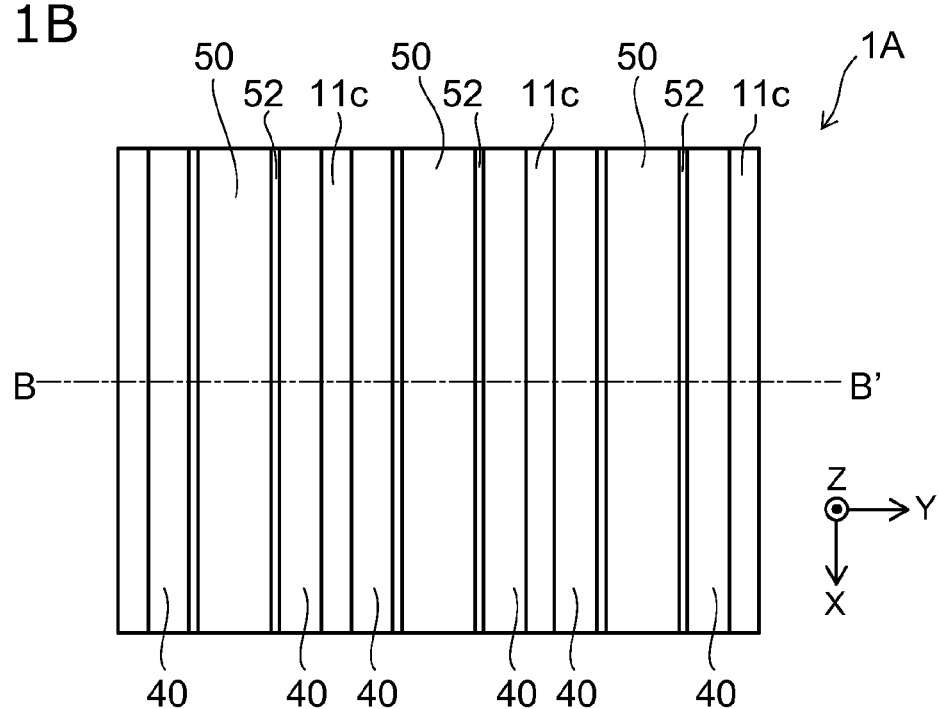
FIG. 1B shows a substantial part plan view of the semiconductor device according to the first embodiment.

FIG. 1A shows a substantial part sectional view of a semiconductor device according to a first embodiment. That is, FIG. 1A is a schematic sectional view taken along line B-B' of FIG. 1B. FIG. 1B shows a substantial part plan view of the semiconductor device according to the first embodiment. That is, FIG. 1B is a schematic plan view taken along line A-A' of FIG. 1A.

The semiconductor device 1A according to the first embodiment is e.g. a MOSFET of the upper/lower electrode structure. The semiconductor device 1A includes a first semiconductor region 20 (hereinafter, e.g., drift region 21 and drain region 22), a second semiconductor region 30 (hereinafter, e.g., base region 30), a third semiconductor region 40 (hereinafter, e.g., source region), a first electrode 11 (hereinafter, e.g., source electrode 11), a second electrode 10 (hereinafter, e.g., drain electrode 10), an insulating film 54 (hereinafter, e.g., gate insulating film 52 and field plate insulating film 53), a third electrode 50 (hereinafter, e.g., gate electrode 50), a fourth electrode 51 (hereinafter, e.g., field plate electrode 51), a connection region 11c, and an interlayer insulating film 55. Here, the direction from the drain electrode 10 toward the source electrode 11 is referred to as Z-direction. A direction orthogonal to the Z-direction is referred to as Y-direction. The direction orthogonal to the Y-direction and the Z-direction is referred to as X-direction.

As shown in FIG. 1A, in the semiconductor device 1A, an n-type drift region 21 is provided on an n$^+$-type drain region 22. The drift region 21 is e.g. an epitaxial growth layer. The impurity concentration of the drain region 22 is e.g. $1\times10^{20}$-$1\times10^{21}$ atoms/cm$^3$. The impurity concentration of the drift region 21 is e.g. $6\times10^{16}$-$2\times10^{17}$ atoms/cm$^3$. In the embodiment, the drain region 22 and the drift region 21 of the same conductivity type may be collectively referred to as semiconductor region 20.

A p-type base region 30 is selectively provided on the drift region 21. The impurity concentration of the base region 30 is e.g. $1\times10^{17}$-$4\times10^{17}$ atoms/cm$^3$. An n$^+$-type source region 40 is selectively provided on the base region 30. The impurity concentration of the source region 40 is e.g. $1\times10^{20}$-$1\times10^{21}$ atoms/cm$^3$.

The gate electrode 50 is provided opposite to the drift region 21, the base region 30, and the source region 40 via the gate insulating film 52. The gate electrode 50 extends from the source electrode 11 side to the drain electrode 10 side. The gate electrode 50 has a trench structure. The gate electrodes 50 are arranged e.g. periodically in the Y-direction.

In the Y-direction, the distance between the adjacent gate electrodes 50 is e.g. 0.8-1.2 µm. The total width of the gate electrode 50 and the gate insulating films 52 on both sides of the gate electrode 50 in the Y-direction is e.g. 0.4-0.6 µm. The structure of the gate electrode 50 combined with the gate insulating films 52 on both sides of the gate electrode 50 in the Y-direction may be a trench gate. In this case, the width of the drift region 21 sandwiched between the adjacent trench gates is e.g. 0.4-0.6 µm. The film thickness of the gate insulating film 52 is e.g. 45-55 nm.

The field plate electrode 51 is provided on the drain electrode 10 side of the gate electrode 50. The field plate electrode 51 is provided opposite to the drift region 21 via the field plate insulating film 53.

The field plate electrode 51 extends from the source electrode 11 side to the drain electrode 10 side. The field plate electrode 51 has a trench structure. The field plate electrodes 51 are arranged e.g. periodically in the Y-direction. The field plate electrode 51 and the gate electrode 50 of the semiconductor device 1A are aligned in the Z-direction. The field plate electrode 51 is in contact with the gate electrode 50.

The total depth of the gate electrode 50, the field plate electrode 51, and the field plate insulating film 53 below the field plate electrode 51 is 2.6-3.4 µm. In the embodiment, the field plate insulating film 53 and the gate insulating film 52 may be collectively referred to as insulating film 54.

Here, in the field plate electrode 51 of the semiconductor device 1A, there are three or more widths. Here, the "width" refers to the length in the Y-direction. For instance, FIG. 1A illustrates width W1, width W2, and width W3 as the widths of the field plate electrode 51.

Thus, in the field plate electrode 51, the plurality of widths are narrowed stepwise from the gate electrode 50 side toward the drain electrode 10 side.

For instance, the film thickness of the field plate insulating film 53 in contact with the field plate electrode 51 of the width W1 is e.g. 75-85 nm. The film thickness of the field plate insulating film 53 in contact with the field plate electrode 51 of the width W2 is e.g. 220-260 nm. The film thickness of the field plate insulating film 53 in contact with the field plate electrode 51 of the width W3 is e.g. 350-450 nm. In this way, the field plate insulating film 53 between the field plate electrode 51 and the semiconductor region 20 has three or more regions. Width of each of the regions in a direction crossing a direction from the gate electrode 50 toward the drain electrode 10 is different. A distance between the field plate electrode 51 and the semiconductor region 20 is changed stepwise in the Z direction.

The source electrode 11 is provided on the source region 40. The source electrode 11 is electrically connected to the source region 40 through the connection region 11c. The connection region 11c is connected also to the base region 30. The drain electrode 10 is provided below the drain region 22. The drain electrode 10 is electrically connected to the drain region 22.

As shown in FIG. 1B, the gate electrode 50, the connection region 11c, and the source region 40 extend in the X-direction. The base region 30 below the source region 40 also extends in the X-direction.

Figure 2:
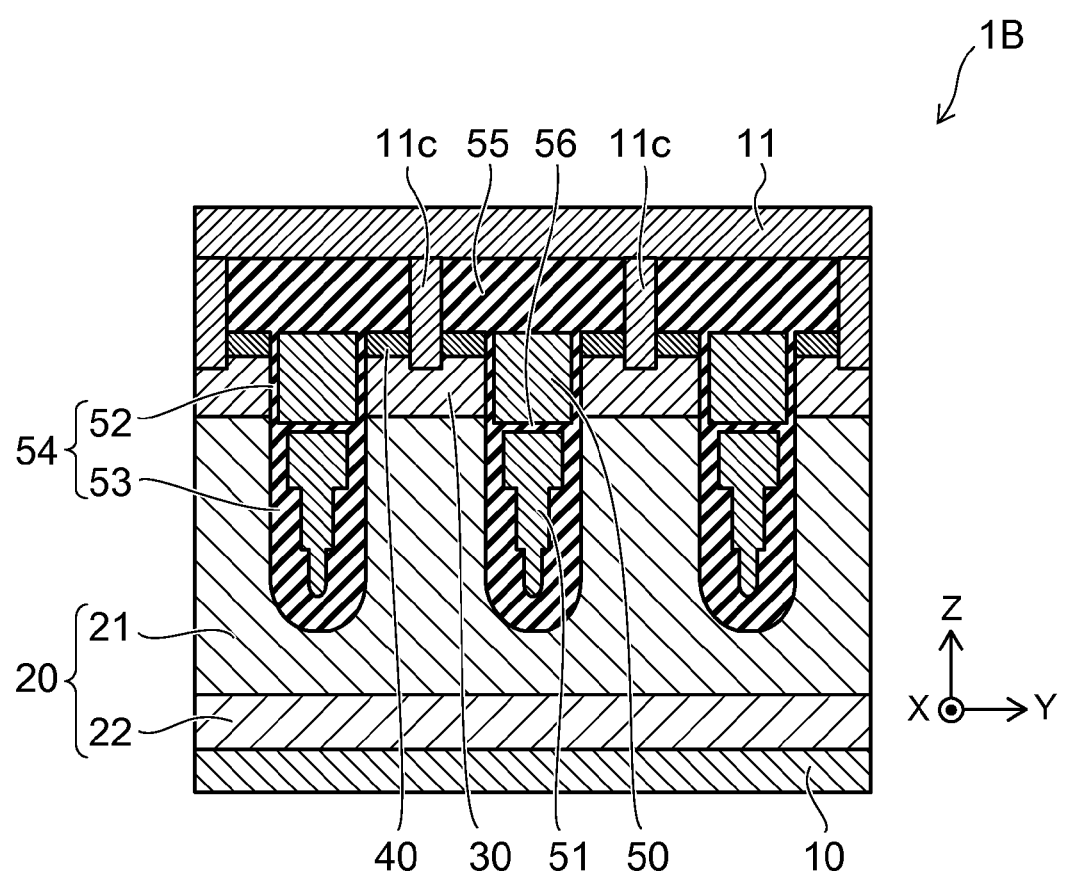
FIG. 2 is a schematic sectional view showing the substantial part of an alternative semiconductor device according to the first embodiment.

FIG. 2 is a schematic sectional view showing the substantial part of an alternative semiconductor device according to the first embodiment. FIG. 2 corresponds to the schematic cross section taken along line B-B' of FIG. 1B.

In the semiconductor device according to the first embodiment, the gate electrode 50 and the field plate electrode 51 may be separated from each other in the Z-direction.

For instance, in a semiconductor device 1B illustrated in FIG. 2, an insulating film 56 is provided between the gate electrode 50 and the field plate electrode 51. Here, the field plate electrode 51 is electrically connected to the source electrode 11.

In such a structure, the gate-drain capacitance Cgd is reduced. This accelerates the switching rate of the semiconductor device.

The plurality of semiconductor regions provided between the drain electrode 10 and the source electrode 11 are composed primarily of e.g. silicon (Si). Alternatively, the plurality of semiconductor regions may be composed primarily of e.g. silicon carbide (SiC) or gallium nitride (GaN). The impurity element of n-type conductivity is e.g. phosphorus (P) or arsenic (As). The impurity element of p-type conductivity is e.g. boron (B). The semiconductor device according to the embodiment can achieve similar effects even if the conductivity types are interchanged between p-type and n-type.

The material of the drain electrode 10 and the material of the source electrode 11 are a metal including at least one selected from the group consisting of e.g. aluminum (Al), titanium (Ti), nickel (Ni), tungsten (W), and gold (Au). The material of the connection region 11c includes at least one selected from e.g. polysilicon and tungsten. The material of the gate electrode 50 includes e.g. polysilicon. The material of the insulating film according to the embodiment includes e.g. silicon oxide and silicon nitride.

The function of the semiconductor device 1A is now described.

Figure 3A:
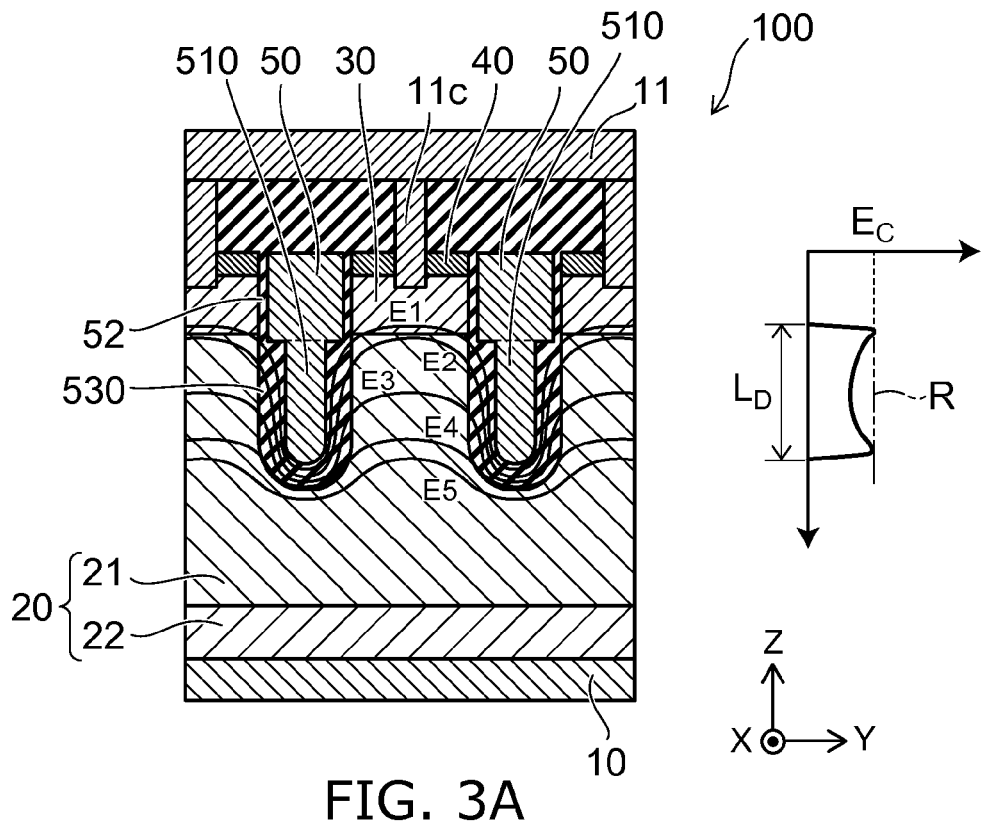
FIG. 3A is a schematic sectional view showing the function of a semiconductor device according to a reference example.
Figure 3B:
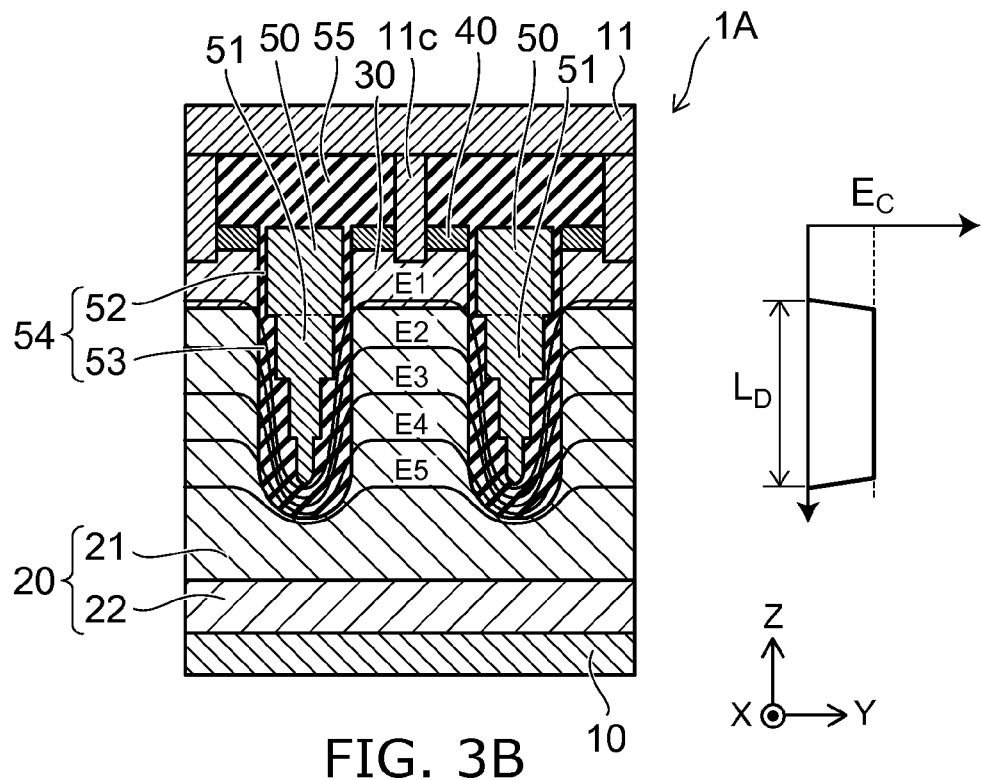
FIG. 3B is a schematic sectional view showing the function of the semiconductor device according to the first embodiment.

FIG. 3A is a schematic sectional view showing the function of a semiconductor device according to a reference example. FIG. 3B is a schematic sectional view showing the function of the semiconductor device according to the first embodiment.

FIGS. 3A and 3B show equipotential lines (E1-E5) of the drift region 21 sandwiched between the adjacent field plate insulating films. Here, the semiconductor device is in the off-state. That is, the gate electrode 50 is applied with a potential lower than the threshold potential (Vth). The drain electrode 10 is applied with a potential higher than the source electrode 11. It is assumed that, for instance, a voltage about to cause avalanche breakdown in the drift region 21 is applied between the source and the drain. The magnitudes of potentials on the equipotential lines (E1-E5) are related as E1<E2<E3<E4<E5.

Furthermore, FIGS. 3A and 3B show an electric field intensity distribution on the right side of the schematic sectional view. In each graph, the horizontal axis represents the electric field intensity ($E_C$). The vertical axis represents the depth ($L_D$) of the semiconductor device. These graphs show the electric field intensity of the drift region 21 from the p-n junction (base region 30/drift region 21) to the position of the lower end of the field plate electrode.

In the semiconductor device 100 according to the reference example (FIG. 3A), the field plate electrode 510 does not have a plurality of widths. As an example, the width in the Y-direction of the field plate electrode 510 is fixed and set to W2 or less. In the Z-direction, the length of the field plate electrode 510 is shorter than the length of the field plate electrode 51.

In the case of the reference example, the thickness of the upper part of the field plate insulating film 530 is thicker than the thickness of the upper part of the field plate insulating film 53 of the semiconductor device 1A. Thus, in the upper part of the field plate insulating film 530, equipotential lines are more likely to concentrate than in the upper part of the field plate insulating film 53. This causes equipotential lines to concentrate also in the p-n junction located near the upper part of the field plate insulating film 530.

Here, in the MOSFET, the breakdown voltage $V_B$ in the drift region 21 is the integrated value of electric field intensity in the region (length) where the depletion layer is formed. The ideal maximum value (ideal breakdown voltage) can be given by the following equation.

$$V_B = E_C \times L_D \quad (1)$$

Here, $E_C$ is the critical electric field causing avalanche breakdown. $L_D$ is the depth (length) from the position of the line of E1 to the position of the line of E5. It is found from Equation (1) that the breakdown voltage $V_B$ increases with the increase of either $E_C$ or $L_D$.

In FIG. 3A, the electric field intensity distribution has a curved shape concave in the Y-direction. In this case, the electric field intensity distribution comes close to the p-n junction. That is, because $L_D$ is small, the breakdown voltage $V_B$ is lower than the ideal breakdown voltage. To improve the breakdown voltage $V_B$, it is preferable that the electric field intensity distribution be flat like the double dot-dashed line (R) shown in FIG. 3A.

In the drift region 21 of the semiconductor device 100, the spacing of equipotential lines is not fixed from the p-n junction to the position of the lower end of the field plate electrode. The electric field is more intense at the p-n junction or the position of the lower end of the field plate electrode. For instance, as shown in FIG. 3A, the spacing of equipotential lines is specifically narrowed at the p-n junction or the position of the lower end of the field plate electrode. Thus, in the semiconductor device 100, avalanche breakdown is likely to occur near the p-n junction or the lower end of the field plate electrode.

Here, in a method, the breakdown voltage $V_B$ is set higher by increasing the length of the field plate electrode 510. However, the electric field intensity distribution in the drift region 21 of the semiconductor device 100 is not made flat even if the length of the field plate electrode 510 is increased. Thus, in the reference example, the improvement of breakdown voltage is limited.

In another method, the impurity concentration of the drift region 21 is set lower to facilitate spreading the depletion layer at off-time. However, in this method, the resistance of the drift region 21 is increased. This increases the on-resistance.

In contrast, in the semiconductor device 1A according to the first embodiment (FIG. 3B), the field plate electrode 51 has a plurality of widths. Furthermore, in the Z-direction, the length of the field plate electrode 51 is longer than the length of the field plate electrode 510.

In the semiconductor device 1A, the thickness of the field plate insulating film 53 becomes thinner from the drain electrode 10 toward the source electrode 11. Thus, from the lower part toward the upper part of the field plate insulating film 53, more equipotential lines are expelled from the field plate insulating film 53 and less likely to concentrate.

Thus, in the drift region 21, the spacing of equipotential lines is made more uniform from the p-n junction to the position of the lower end of the field plate electrode. That is, in the drift region 21, the electric field intensity distribution is made flatter from the p-n junction to the position of the lower end of the field plate electrode. As a result, the breakdown voltage $V_B$ is improved in the semiconductor device 1A.

Furthermore, because the breakdown voltage $V_B$ is improved, the impurity concentration of the drift region 21 can be set higher. That is, in the semiconductor device 1A, the on-resistance can be reduced.

A method for manufacturing the semiconductor device 1A according to the first embodiment is now described.

FIGS. 4A to 9B are schematic sectional views showing a method for manufacturing the substantial part of the semiconductor device according to the first embodiment.

Figure 4A:
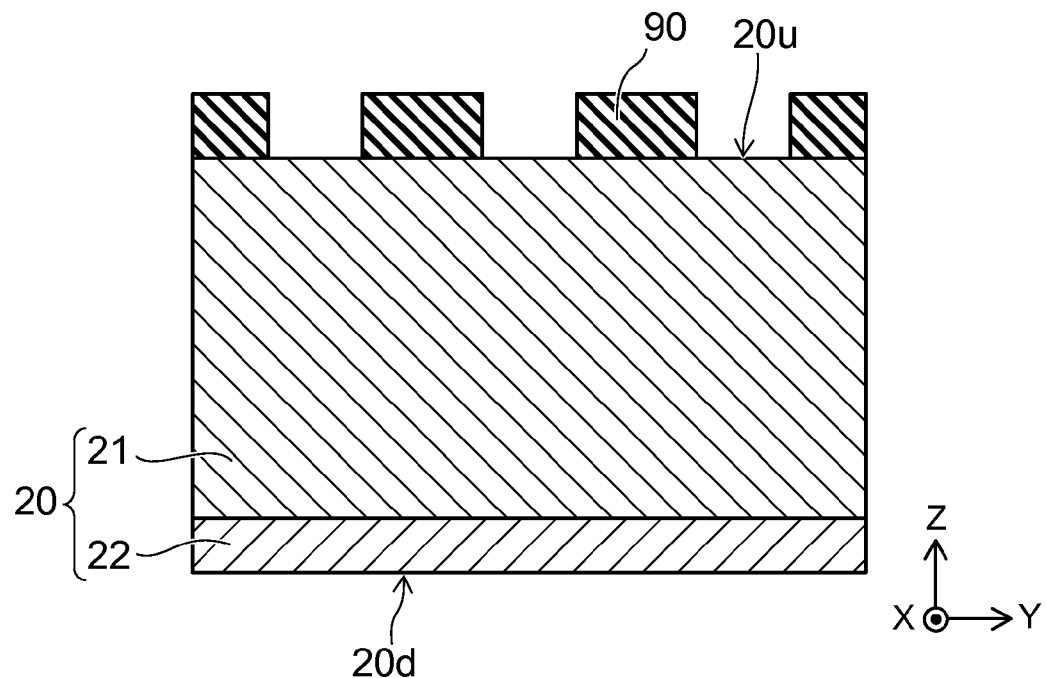
FIGS. 4A to 9B are schematic sectional views showing a method for manufacturing the substantial part of the semiconductor device according to the first embodiment.

For instance, as shown in FIG. 4A, a semiconductor region 20 having a first surface (hereinafter, e.g., lower surface 20d) and a second surface (hereinafter, e.g., upper surface 20u) is prepared. Next, a mask layer 90 is patterned on the semiconductor region 20.

Next, the drift region 21 exposed from the mask layer 90 is subjected to RIE (reactive ion etching).

Figure 4B:
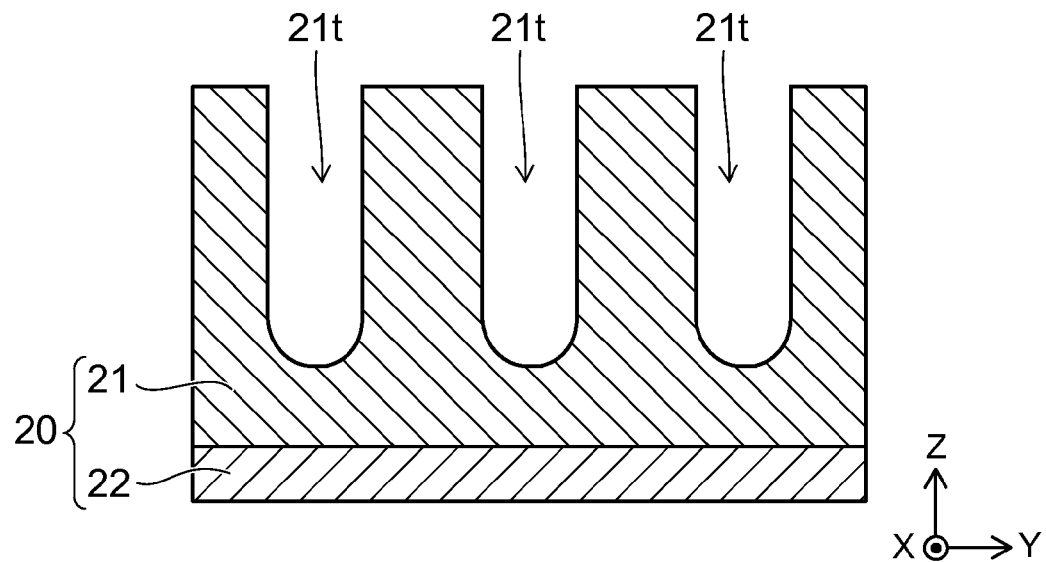

Thus, as shown in FIG. 4B, a trench 21t is formed in the semiconductor region 20 from the upper surface 20u toward the lower surface 20d side of the semiconductor region 20. CDE (chemical dry etching) may be performed in the trench 21t in order to smooth the inner wall of the trench 21t. Furthermore, a thermal oxide film may be formed in the trench 21t, and then removed. After forming the trench 21t, the mask layer 90 is removed.

Figure 5A:
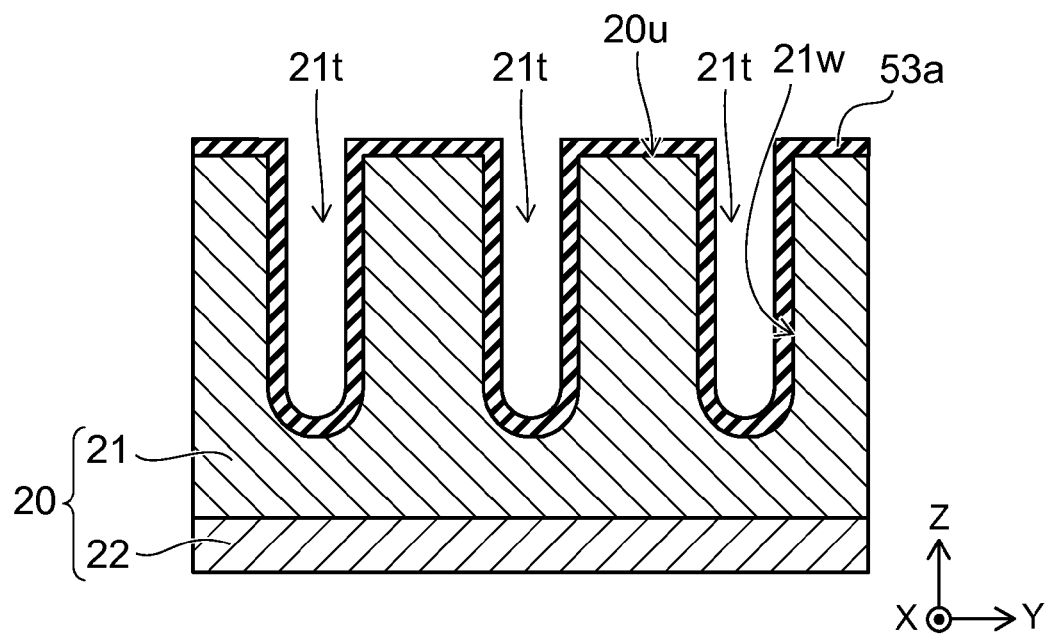

Next, as shown in FIG. 5A, an insulating film 53a is formed on the inner wall 21w of the trench 21t and the upper surface 20u of the semiconductor region 20 by CVD (chemical vapor deposition) or thermal oxidation technique. The insulating film 53a includes e.g. silicon oxide.

Figure 5B:
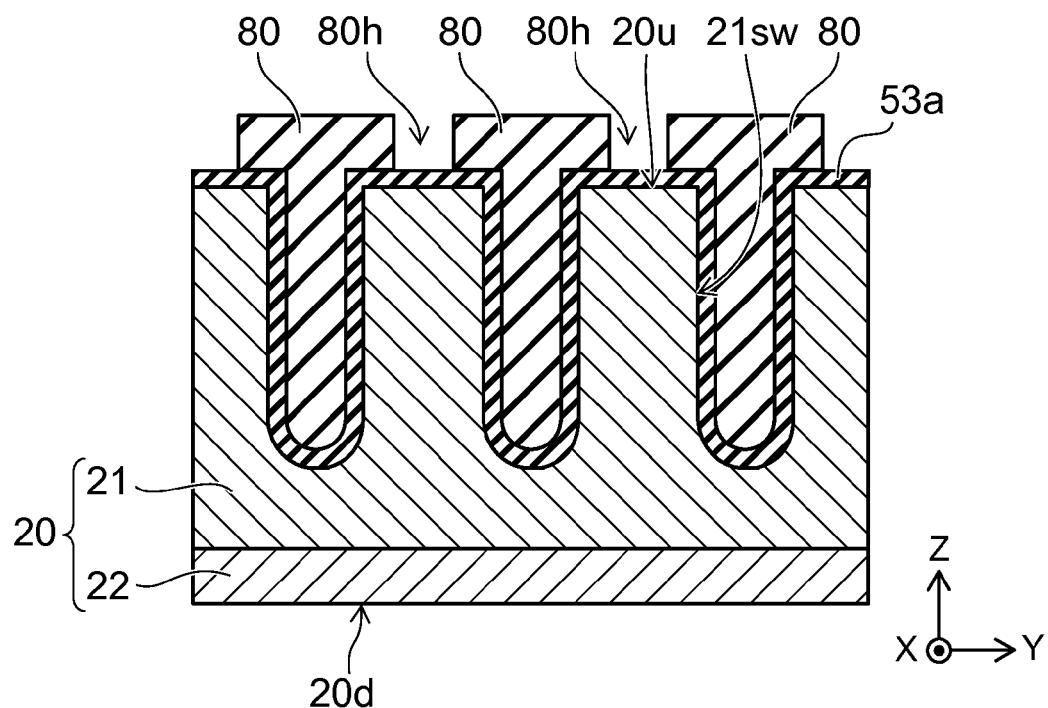

Next, as shown in FIG. 5B, a mask layer 80 is formed via the insulating film 53a in the trench 21t. Furthermore, the mask layer 80 is formed via the insulating film 53a also on the semiconductor region 20. The mask layer 80 includes resist. The mask layer 80 is selectively provided with an opening 80h. The opening 80h is located e.g. between the trenches 21t adjacent in the Y-direction.

Figure 6A:
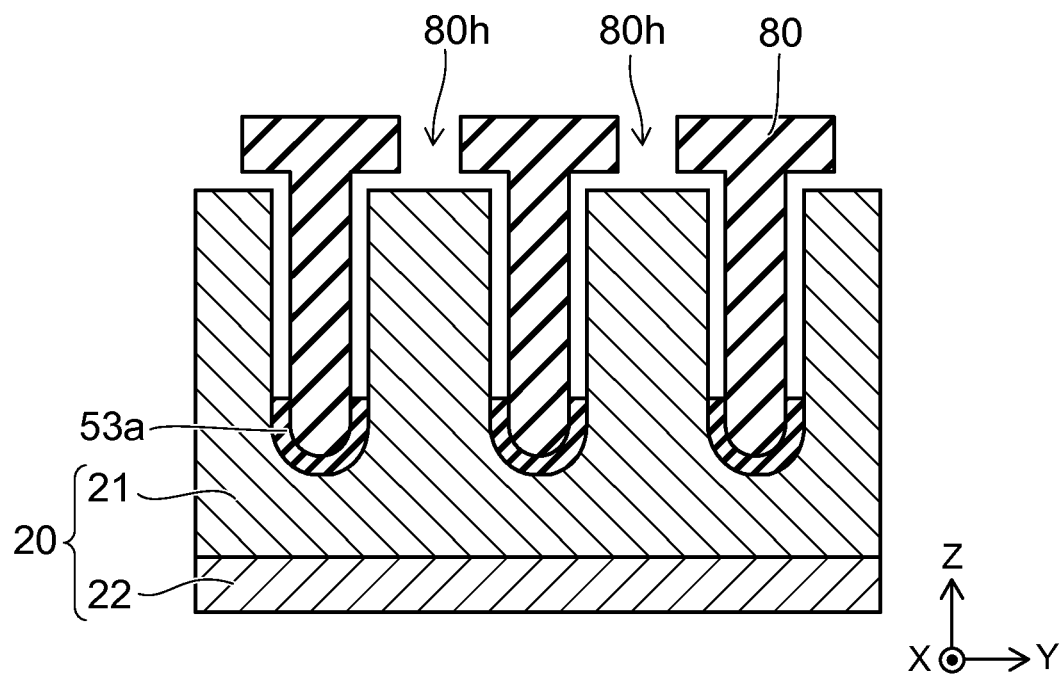

Next, as shown in FIG. 6A, the insulating film 53a is exposed to an etching liquid through the opening 80h of the mask layer 80. The etching liquid is e.g. a hydrofluoric acid-based solution. Thus, part of the upper surface 20u side of the insulating film 53a is removed. Subsequently, the mask layer 80 is removed by e.g. ashing.

Figure 6B:
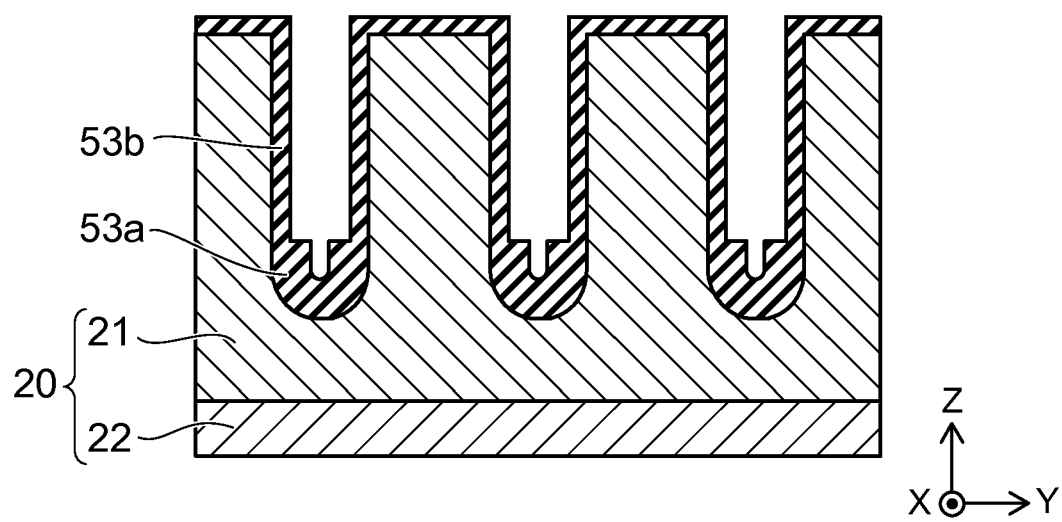

Next, as shown in FIG. 6B, an insulating film 53b is formed on the inner wall 21w of the trench 21t and the upper surface 20u of the semiconductor region 20 by CVD or thermal oxidation technique. The insulating film 53b includes e.g. silicon oxide.

Here, on the insulating film 53a, the insulating film 53b of the same ingredient is formed. The insulating film 53b on the insulating film 53a is integrated with the insulating film 53a. Thus, the film thickness of the insulating film 53a is made thicker than that of the insulating film 53b. Accordingly, a step difference occurs between the insulating film 53b and the insulating film 53a.

Figure 7A:
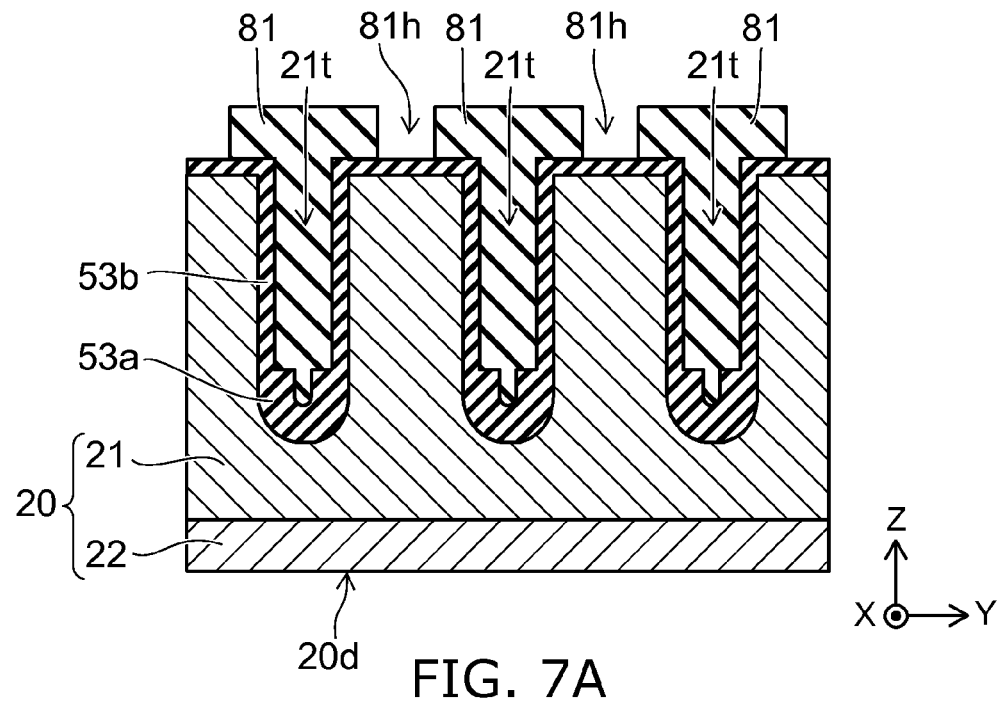

Next, as shown in FIG. 7A, a mask layer 81 is formed via the insulating film 53a, 53b in the trench 21t. Furthermore, the mask layer 81 is formed via the insulating film 53b on the semiconductor region 20. The mask layer 81 includes resist. The mask layer 81 is selectively provided with an opening 81h. The opening 81h is located e.g. between the trenches 21t adjacent in the Y-direction.

Figure 7B:
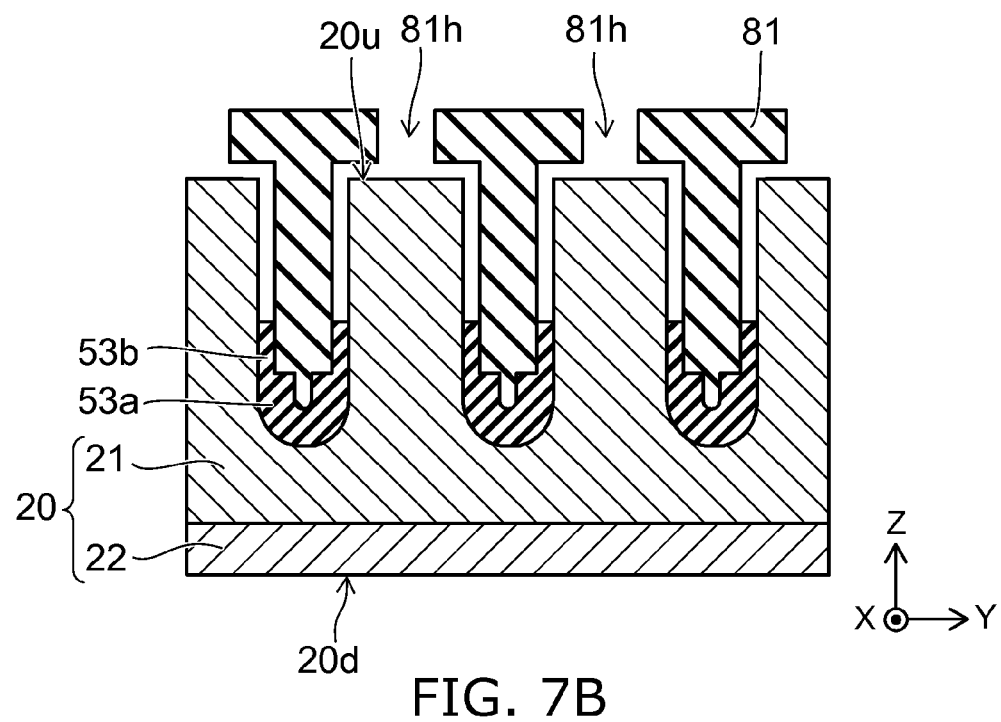

Next, as shown in FIG. 7B, the insulating film 53b is exposed to an etching liquid through the opening 81h of the mask layer 81. The etching liquid is e.g. a hydrofluoric acid-based solution. Thus, part of the upper surface 20u side of the insulating film 53b is removed. Subsequently, the mask layer 81 is removed by e.g. ashing.

As described above, the following process is repeated in the first embodiment. The process includes the step of forming a first insulating film having a prescribed thickness on the side surface of the trench 21t, removing part of the upper surface 20u side of the first insulating film, and then forming again a second insulating film on the side surface of the trench 21t from which the first insulating film is removed, and on the first insulating film. The process further includes the step of removing part of the upper surface 20u side of the second insulating film formed on the side surface of the trench 21t from which the first insulating film is removed, the first insulating film and the second insulating film then being redefined as the first insulating film.

Figure 8A:
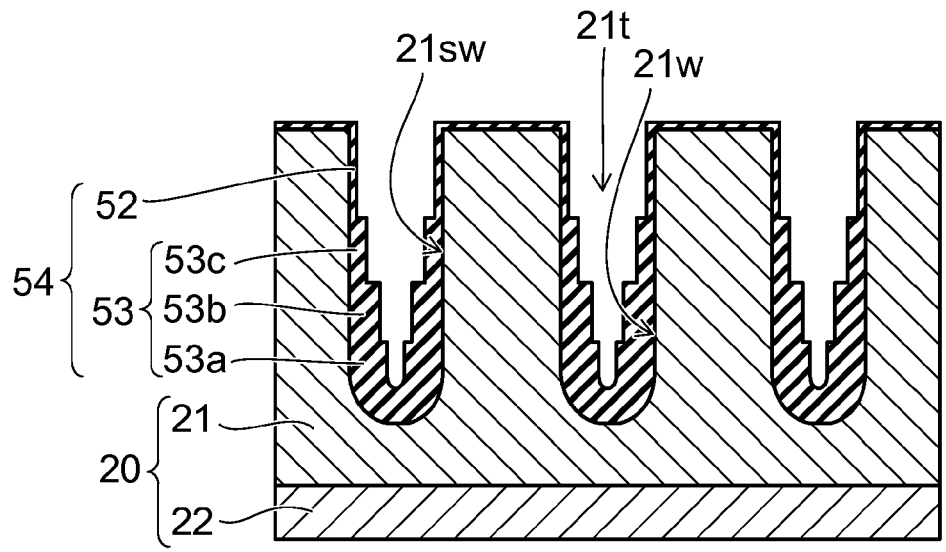

Thus, as shown in FIG. 8A, for instance, an insulating film 54 having e.g. four or more film thicknesses is formed along the inner wall 21w of the trench 21t. The insulating film 54 has four or more regions. A film thickness of each of the regions is different. In the insulating film 54, the film thickness is thickened stepwise from the lower surface 20d side toward the upper surface 20u side of the semiconductor region 20. For instance, on the side surface 21sw of the trench 21t, the insulating film 54 has four or more film thicknesses. Here, the insulating film 54 having four film thicknesses includes field plate insulating films 53a, 53b, 53c, and a gate insulating film 52. In the insulating film 54, the insulating film having the smallest film thickness corresponds to the gate insulating film 52. The insulating film below the gate insulating film 52 corresponds to the field plate insulating film 53.

Figure 8B:
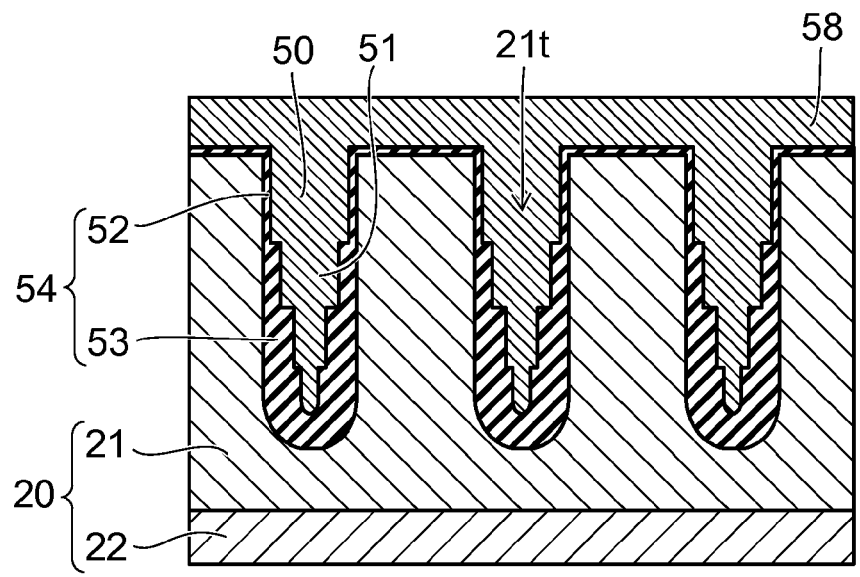

Next, as shown in FIG. 8B, a conductive layer 58 is formed via the insulating film 54 in the trench 21t by CVD.

The conductive layer 58 is formed via the insulating film 54 also on the semiconductor region 20. The conductive layer 58 includes e.g. polysilicon.

Thus, in the trench 21t, a gate electrode 50 is formed via the gate insulating film 52. Furthermore, a field plate electrode 51 is formed via the field plate insulating film 53 below the gate electrode 50.

In the case of forming the semiconductor device 1B, etch-back is performed so that the surface of the conductive layer 58 is located below the lower end of the gate insulating film 52. An insulating film 56 is formed on the etched-back conductive layer 58. A conductive layer 58 is formed again on the insulating film 56.

Subsequently, the conductive layer 58 and the insulating film 54 provided on the semiconductor region 20 are removed by e.g. CMP (chemical mechanical polishing).

Figure 9A:
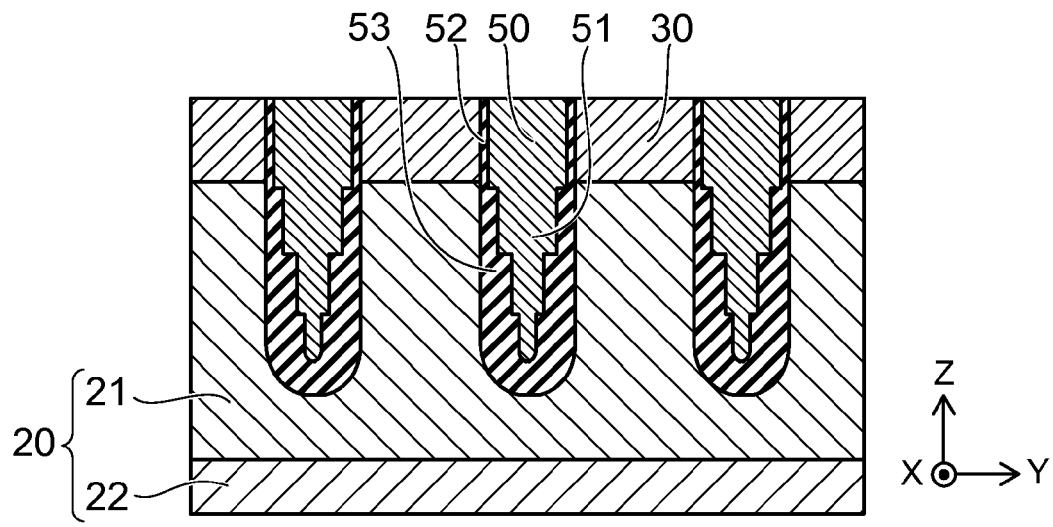
Figure 9B:
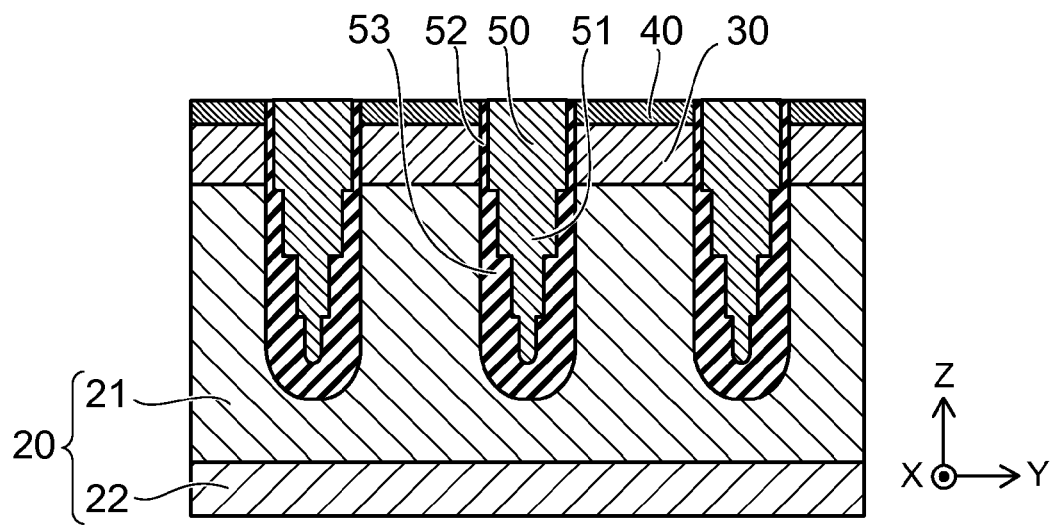

Next, as shown in FIG. 9A, a p-type impurity element is implanted on the semiconductor region 20. Thus, a base region 30 is selectively formed on the semiconductor region 20. Next, as shown in FIG. 9B, an n-type impurity element is implanted on the base region 30. Thus, a source region 40 is selectively formed on the base region 30. Then, annealing treatment is performed to activate the impurity elements.

Subsequently, as shown in FIG. 1A, an interlayer insulating film 55 is formed on each of part of the source region 40, the gate electrode 50, and the gate insulating film 52. Next, a source electrode 11 electrically connected to the source region 40 is formed via a connection region 11c on the source region 40. Furthermore, a drain electrode 10 electrically connected to the semiconductor region 20 is formed below the semiconductor region 20.

FIGS. 10A and 10B show schematic sectional views of the substantial part of a semiconductor device according to variations of the first embodiment. That is, FIGS. 10A and 10B are schematic sectional views corresponding to the position of line B-B' of FIG. 1B.

The number of widths of the field plate electrode 51 is not limited to three as described above. For instance, the number of widths may be four or more. More specifically, the following process is repeated prescribed times. The process includes the step of forming a first insulating film having a prescribed thickness on the side surface of the trench 21t, and removing part of the upper surface 20u side of the first insulating film. The process further includes the step of forming again a second insulating film on the side surface of the trench 21t from which the first insulating film is removed, and on the first insulating film, and removing part of the upper surface 20u side of the second insulating film formed on the side surface of the trench 21t from which the first insulating film is removed, the first insulating film and the second insulating film then being redefined as the first insulating film. Thus, a field plate electrode 51 having a prescribed number of widths is formed.

For instance, FIG. 10A illustrates a field plate electrode 51 having five widths. FIG. 10B illustrates a field plate electrode 51 having seven widths. The number of widths of the field plate electrode 51 is not limited to the number illustrated in FIGS. 10A and 10B.

Thus, the number of widths of the field plate electrode 51 is increased. Accordingly, in the drift region 21 of the semiconductor device 1C, the spacing of equipotential lines is made more uniform from the p-n junction to the position of the lower end of the field plate electrode. As a result, the breakdown voltage $V_B$ is further improved in the semiconductor device 1C.

Furthermore, because the breakdown voltage $V_B$ is improved, the impurity concentration of the drift region 21 can be set higher. That is, in the semiconductor device 1C, the on-resistance can be further reduced.

In the semiconductor device 1D, the number of widths of the field plate electrode 51 is still larger than in the semiconductor device 1C. Thus, the breakdown voltage $V_B$ is further increased. Furthermore, the on-resistance can be further decreased in the semiconductor device 1D.

The number of widths of the field plate electrode 51 illustrated below is illustrative only. The number of widths is not limited to the number shown in the drawings.

Second Embodiment

Figure 11:
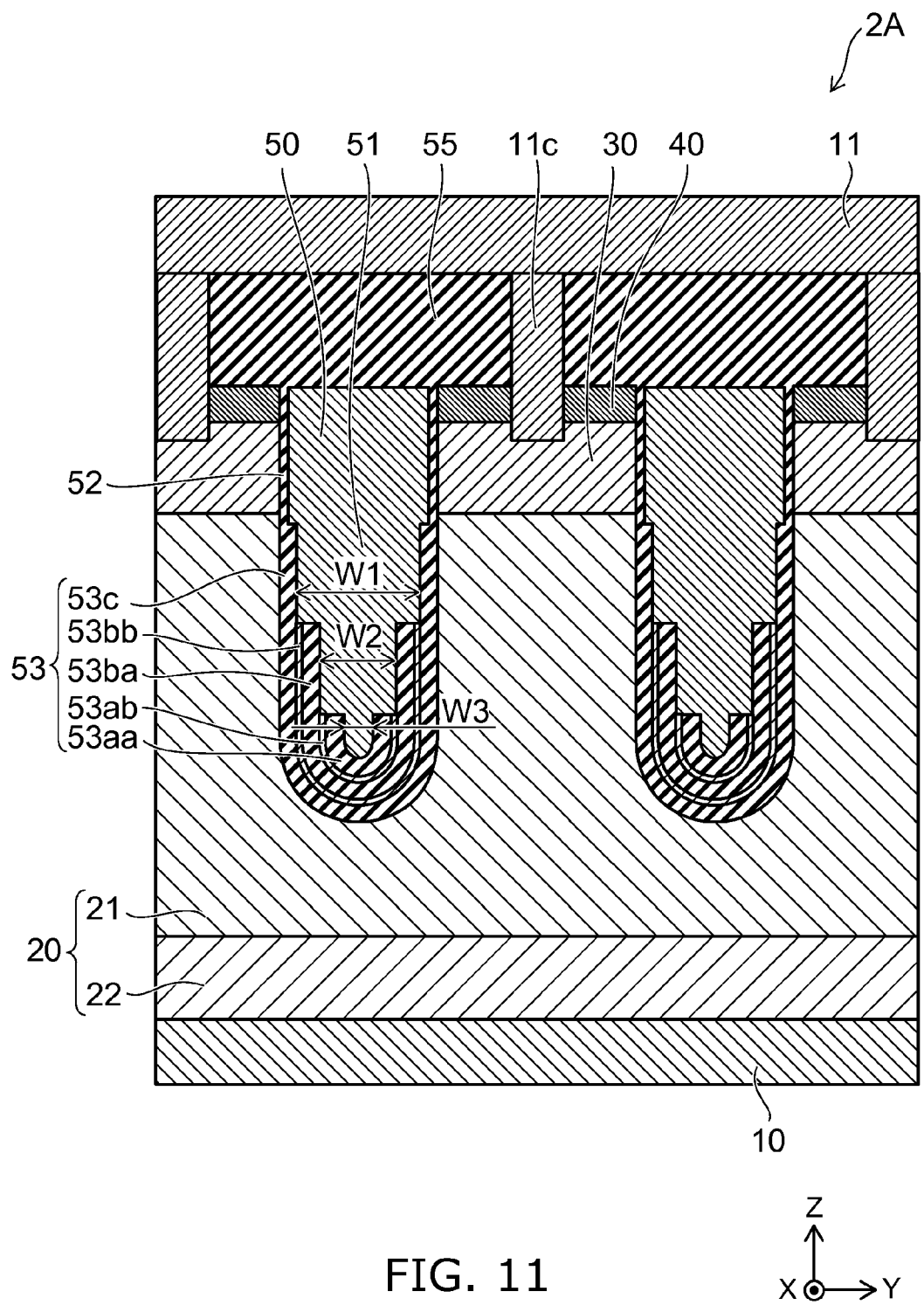
FIG. 11 is a schematic sectional view showing the substantial part of a semiconductor device according to a second embodiment.

FIG. 11 is a schematic sectional view showing the substantial part of a semiconductor device according to a second embodiment.

The semiconductor device 2A shown in FIG. 11 has the same configuration as the semiconductor device 1A except the field plate insulating film 53.

However, in the semiconductor device 2A, the field plate insulating film 53 has a structure in which oxide films and nitride films are alternately arranged from the semiconductor region 20 side. Here, the oxide film is e.g. a silicon oxide film. The nitride film is e.g. a silicon nitride film.

For instance, the field plate insulating film 53 has a stacked structure in which an oxide film 53c, a nitride film 53bb, an oxide film 53ba, a nitride film 53ab, and an oxide film 53aa are stacked in this order from the semiconductor region 20 side toward the field plate electrode 51 side.

In the stacked structure, the distances from the two oxide films sandwiching one nitride film to the semiconductor region 20 are different. For instance, the distances from the two oxide films 53c, 53ba sandwiching the nitride film 53bb to the semiconductor region 20 are different. For instance, the distance between the oxide film 53ba and the semiconductor region 20 is longer than the distance between the oxide film 53c and the semiconductor region 20.

Furthermore, the distances from the two oxide films 53ba, 53aa sandwiching the nitride film 53ab to the semiconductor region 20 are different. For instance, the distance between the oxide film 53aa and the semiconductor region 20 is longer than the distance between the oxide film 53ba and the semiconductor region 20.

Thus, a step difference occurs between the oxide film 53c and the oxide film 53ba. A step difference occurs between the oxide film 53ba and the oxide film 53aa. Thus, the field plate electrode 51 of the semiconductor device 2A has a plurality of widths (e.g., width W1, width W2, and width W3).

The plurality of widths are narrowed stepwise from the gate electrode 50 side toward the drain electrode 10 side. Here, the number of widths of the field plate electrode 51 of the semiconductor device 2A is not limited to three as described above. For instance, the number of widths may be three or more.

Also in the semiconductor device 2A, the field plate electrode 51 has three or more widths. Thus, the semiconductor device 2A achieves the same effect as the semiconductor device 1A.

Figure 12:
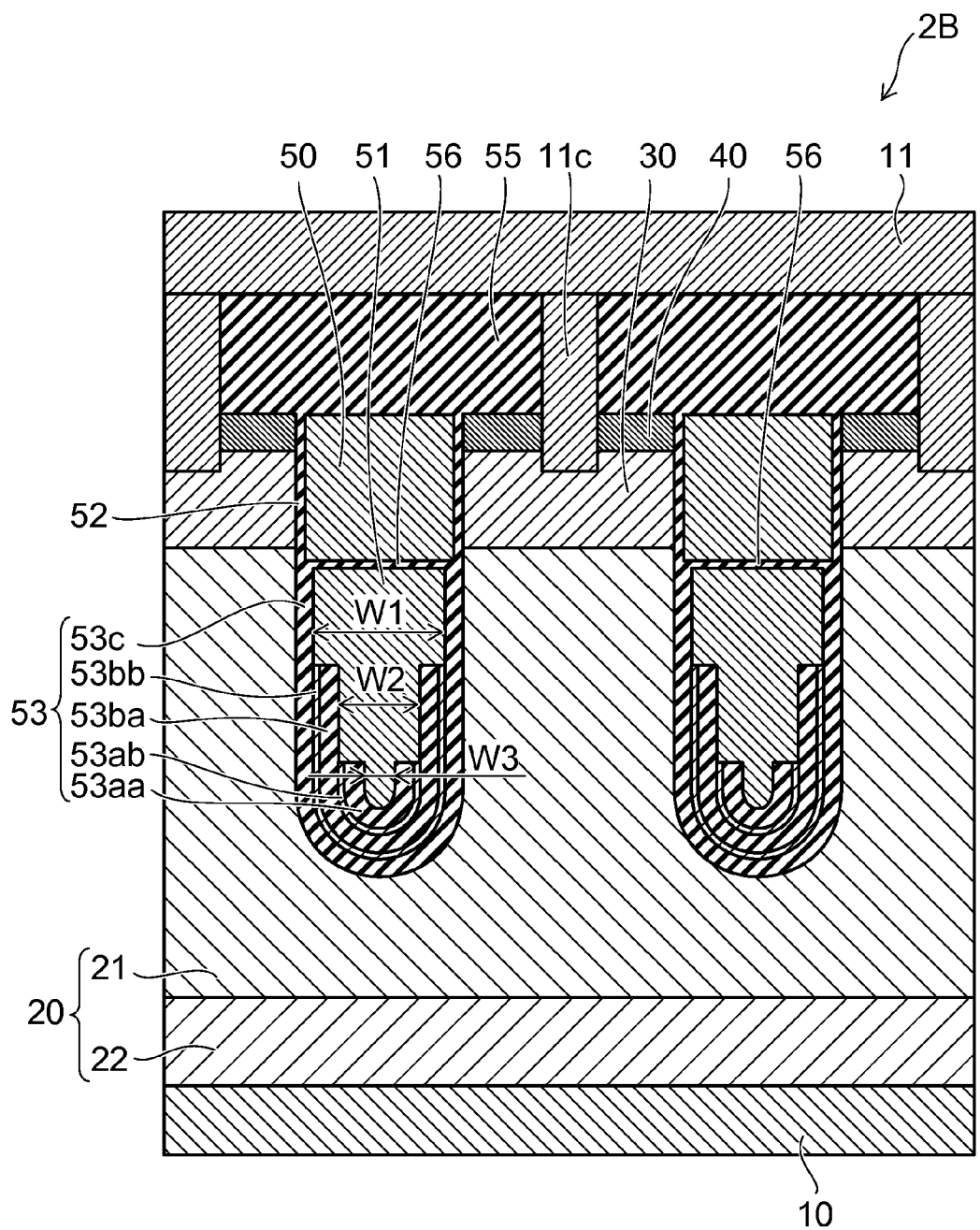
FIG. 12 is a schematic sectional view showing the substantial part of an alternative semiconductor device according to the second embodiment.

FIG. 12 is a schematic sectional view showing the substantial part of an alternative semiconductor device according to the second embodiment.

In the semiconductor device according to the second embodiment, the gate electrode 50 and the field plate electrode 51 may be separated from each other in the Z-direction.

For instance, in the semiconductor device 2B illustrated in FIG. 12, an insulating film 56 is provided between the gate electrode 50 and the field plate electrode 51. Here, the field plate electrode 51 is electrically connected to the source electrode 11.

In such a structure, the gate-drain capacitance $C_{gd}$ is reduced. This accelerates the switching rate of the semiconductor device.

A method for manufacturing the semiconductor device 2A according to the second embodiment is now described.

FIGS. 13 to 20 are schematic sectional views showing a method for manufacturing the substantial part of the semiconductor device according to the second embodiment.

Figure 13:
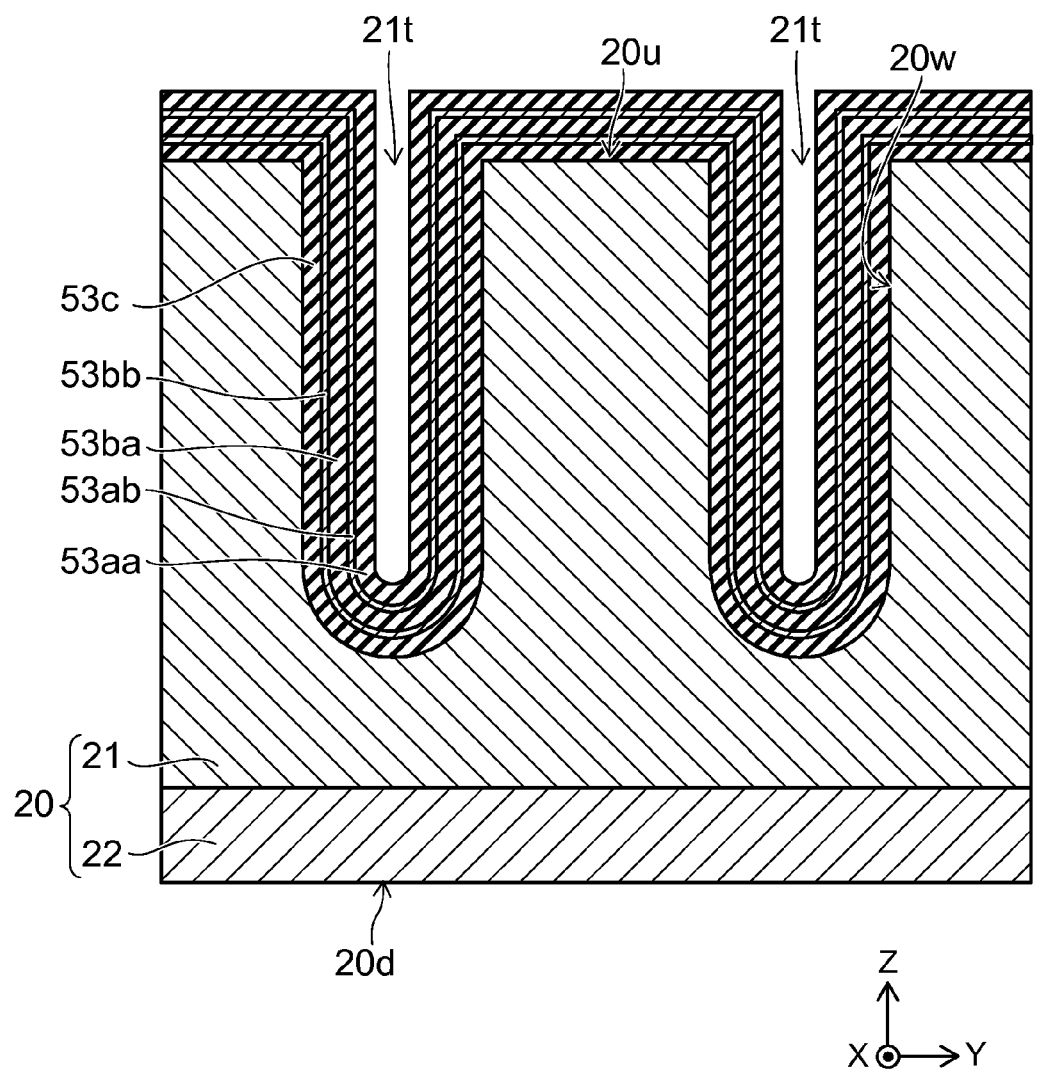
FIGS. 13 to 20 are schematic sectional views showing a method for manufacturing the substantial part of the semiconductor device according to the second embodiment.

For instance, as shown in FIG. 13, a stacked film is formed along the inner wall 20w of a trench 21t provided in the semiconductor region 20. In the stacked film, oxide films and nitride films are alternately arranged from the semiconductor region 20 side. In the stacked film, the oxide film is exposed in the trench 21t. For instance, a stacked film is formed so that an oxide film 53c, a nitride film 53bb, an oxide film 53ba, a nitride film 53ab, and an oxide film 53aa are stacked in this order from the semiconductor region 20 side toward the center of the trench 21t. Here, the oxide film 53aa is exposed in the trench 21t.

Figure 14:
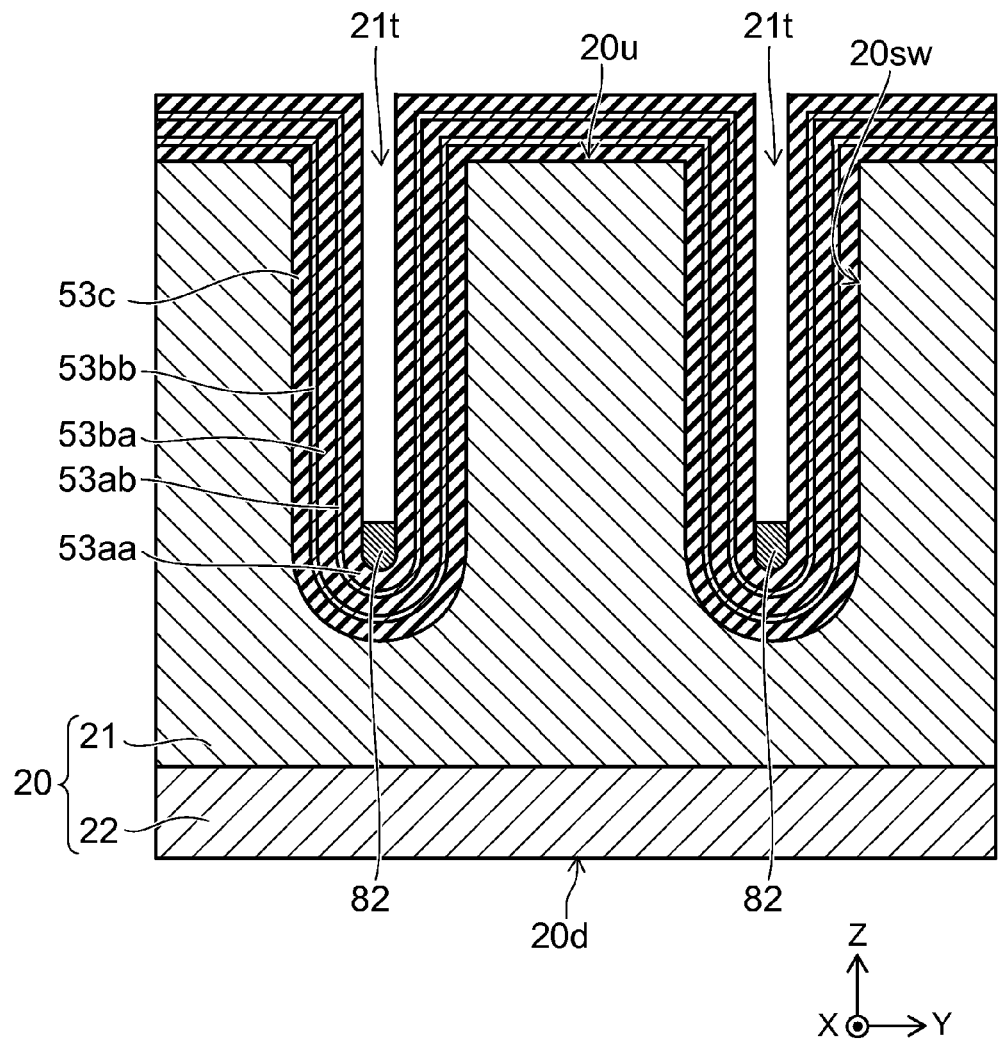

Next, as shown in FIG. 14, a mask layer 82 is formed on part of the oxide film 53aa formed on the side surface 21sw of the trench 21t. The mask layer 82 includes e.g. polysilicon. The mask layer 82 is formed on the oxide film 53aa of the lower surface 20d side of the semiconductor region 20 by CVD and etch-back.

The etch-back of the mask layer 82 is performed using an etching gas preferentially etching polysilicon relative to the oxide film 53aa. For instance, the gas is a mixed gas of oxygen ($O_2$)/fluorine-based gas.

Figure 15:
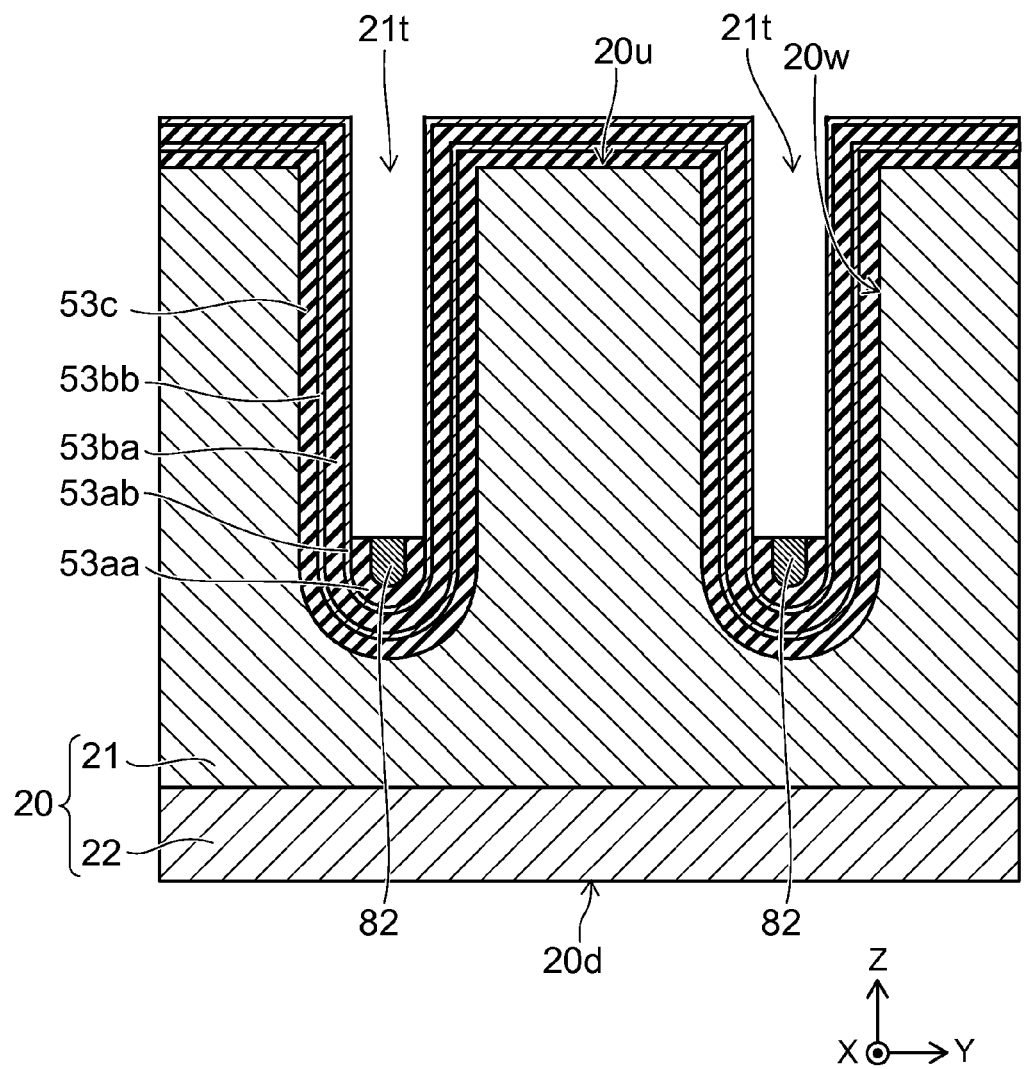

Next, as shown in FIG. 15, the oxide film 53aa exposed from the mask layer 82 is selectively removed by wet etching using a hydrofluoric acid-based solution. Thus, part of the nitride film 53ab is exposed. The nitride film 53ab functions as an etching stopper film for selectively removing the oxide film 53aa.

Figure 16:
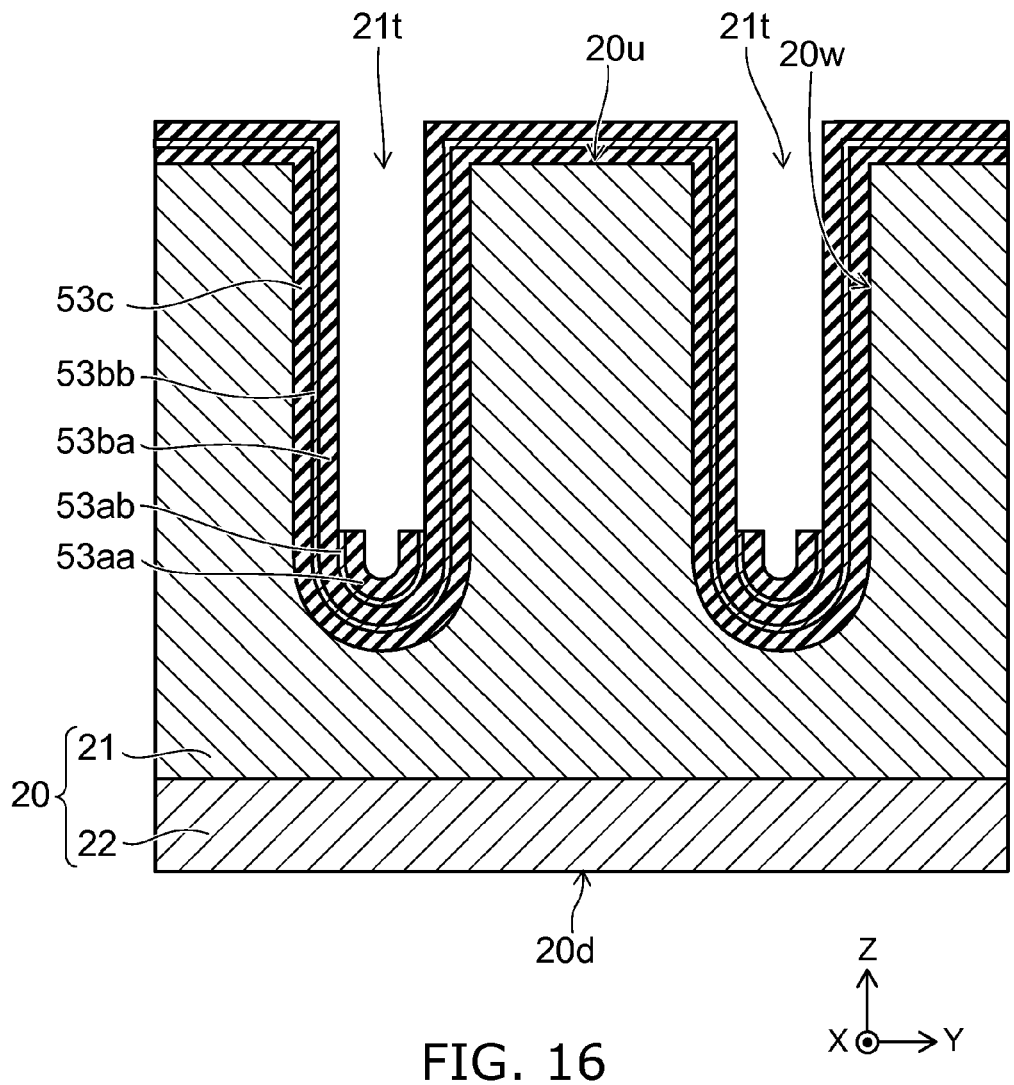

Next, as shown in FIG. 16, a mixed gas of oxygen ($O_2$)/fluorine-based gas is used as an etching gas to remove the mask layer 82. Here, the nitride film 53ab is thinner than the oxide film 53aa. For instance, the film thickness of the nitride film 53ab is several ten nm. In the step of removing the mask layer 82, the nitride film 53ab is removed together by the oxygen ($O_2$)/fluorine-based gas.

Here, the mask layer 82 may be removed by wet etching using a nitric acid-based solution without using an etching gas. The nitride film 53ab may be removed by wet etching using a phosphoric acid-based solution.

Figure 17:
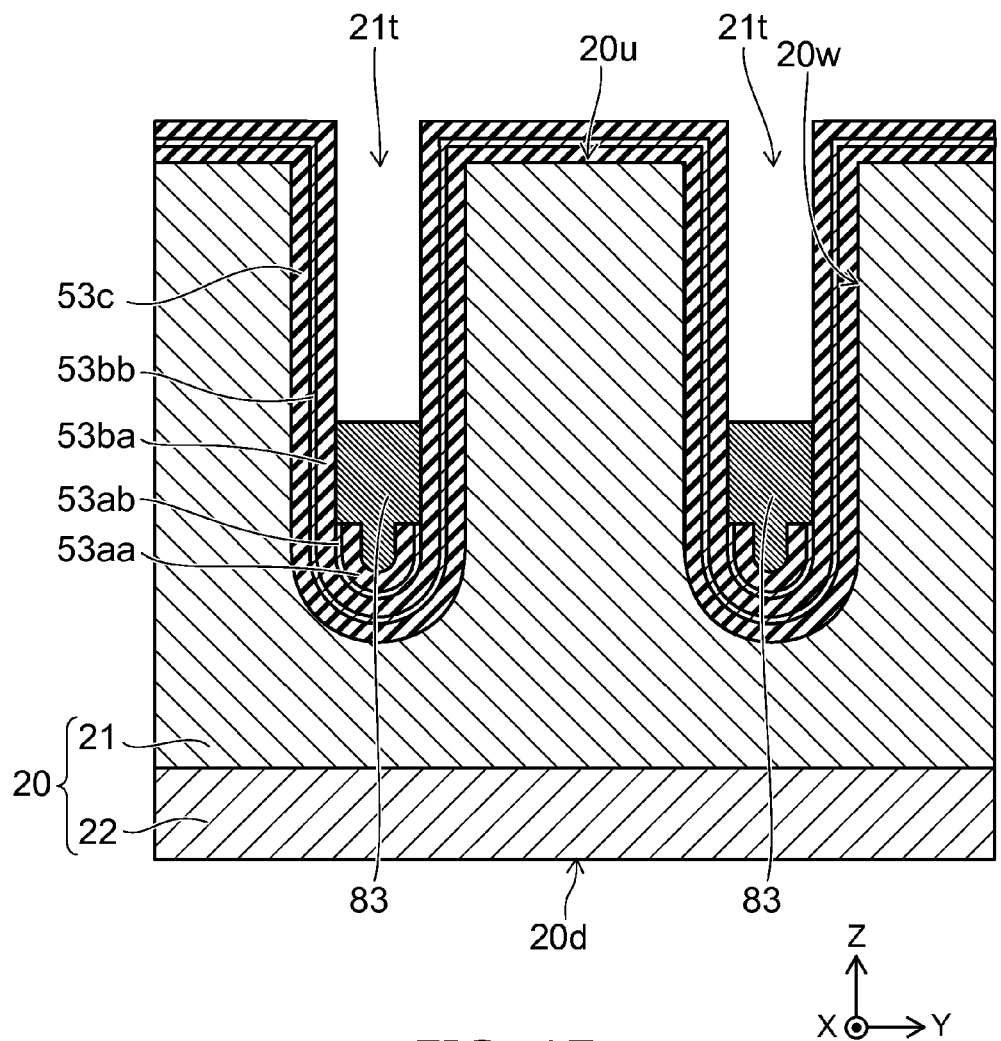

Next, as shown in FIG. 17, a mask layer 83 is formed on part of the oxide film 53ba formed on the side surface 21sw of the trench 21t. The mask layer 83 includes e.g. polysilicon. The mask layer 83 is formed on the oxide film 53ba of the lower surface 20d side of the semiconductor region 20 by CVD and etch-back.

The etch-back of the mask layer 83 is performed using an etching gas preferentially etching polysilicon relative to the oxide film 53ba. For instance, the gas is a mixed gas of oxygen ($O_2$)/fluorine-based gas.

Figure 18:
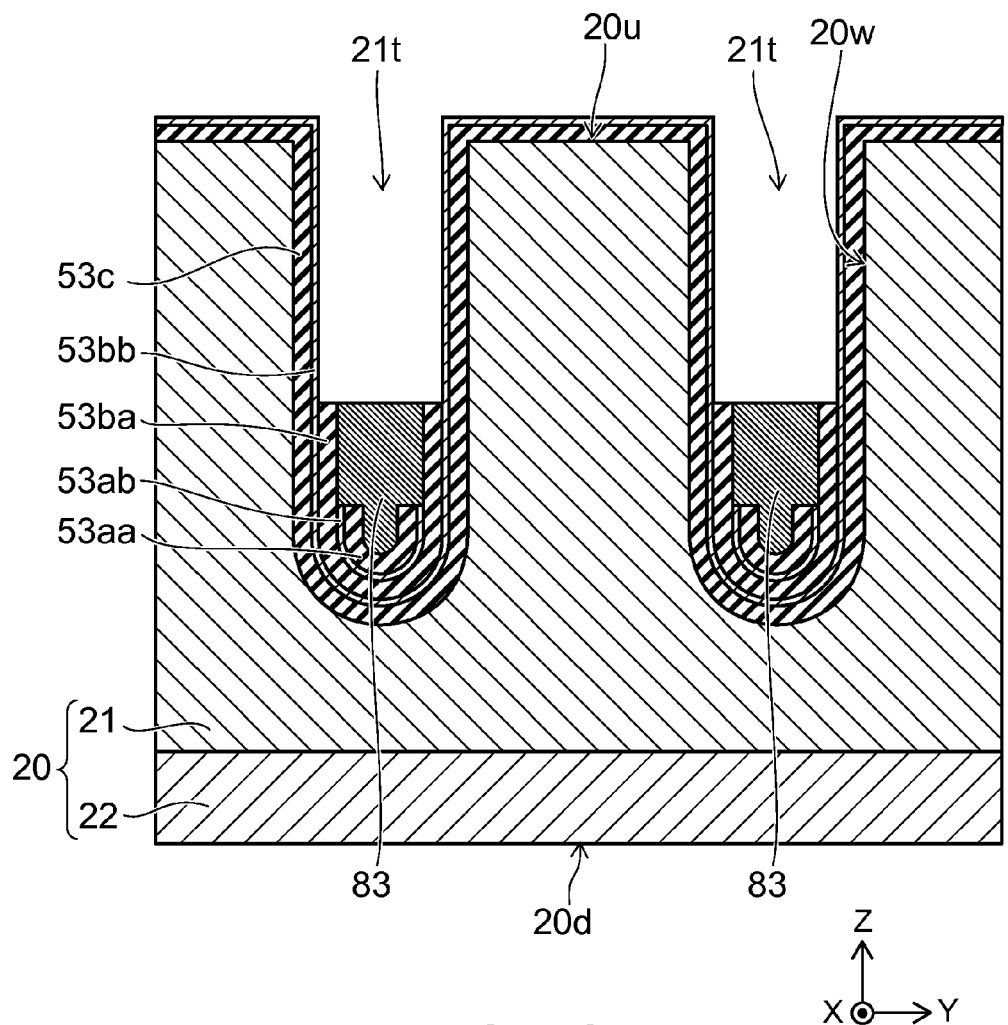

Next, as shown in FIG. 18, the oxide film 53ba exposed from the mask layer 83 is selectively removed by wet etching using a hydrofluoric acid-based solution. Thus, part of the nitride film 53bb is exposed. The nitride film 53bb functions as an etching stopper film for selectively removing the oxide film 53ba.

Figure 19:
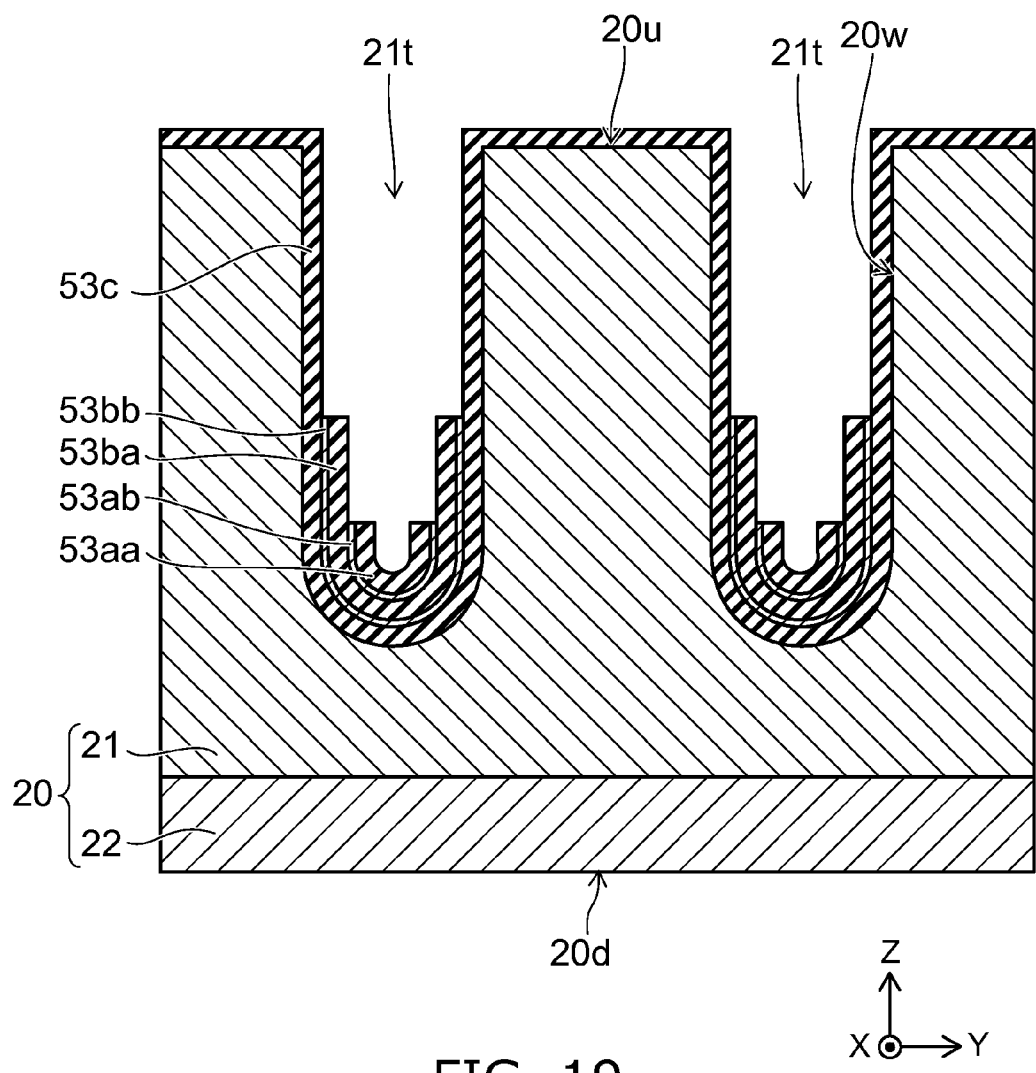

Next, as shown in FIG. 19, a mixed gas of oxygen ($O_2$)/fluorine-based gas is used as an etching gas to remove the mask layer 83. Here, the nitride film 53bb is thinner than the oxide film 53ba. For instance, the film thickness of the nitride film 53bb is several ten nm. In the step of removing the mask layer 83, the nitride film 53bb is removed together by the oxygen ($O_2$)/fluorine-based gas.

Here, the mask layer 83 may be removed by wet etching using a nitric acid-based solution without using an etching gas. The nitride film 53bb may be removed by wet etching using a phosphoric acid-based solution.

Figure 20:
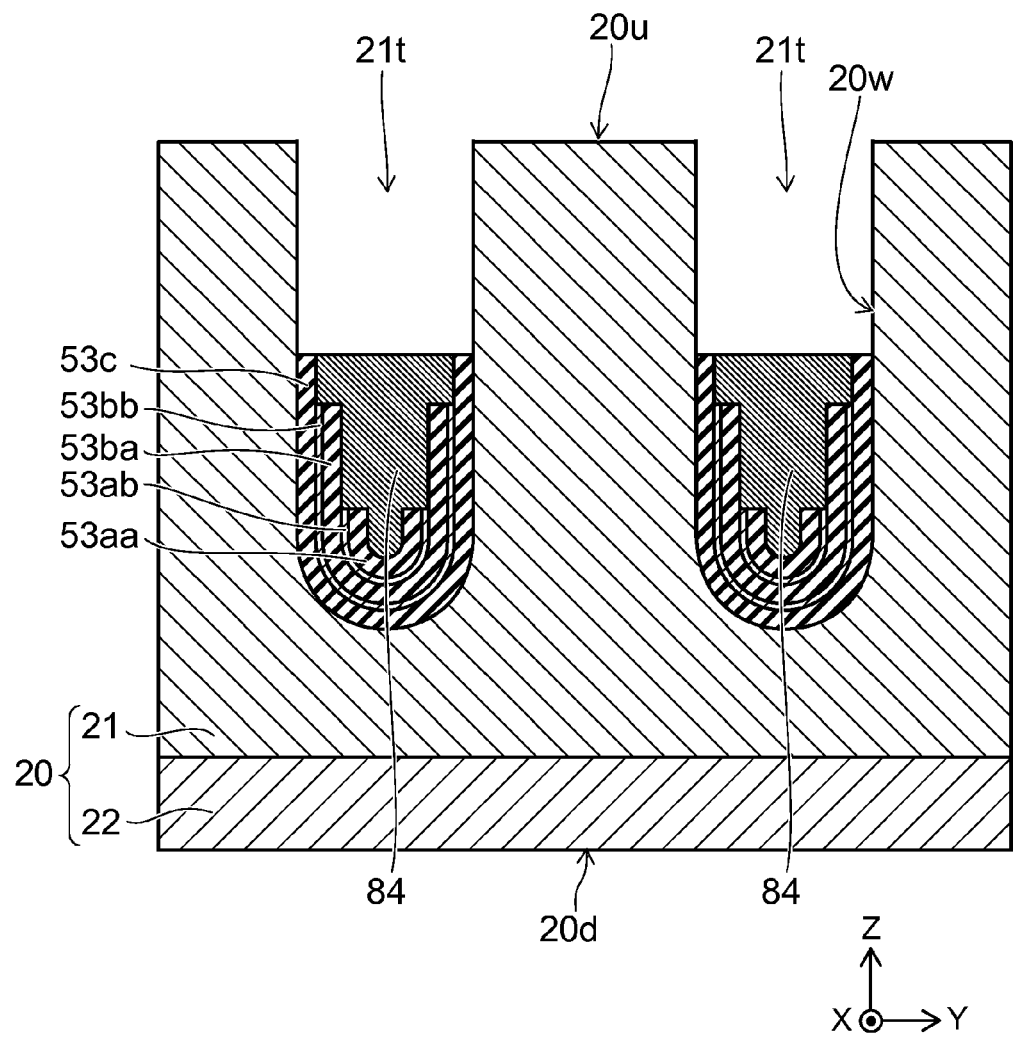

Next, as shown in FIG. 20, a mask layer 84 is formed on part of the oxide film 53c formed on the side surface 21sw of the trench 21t. The mask layer 84 includes e.g. polysilicon. The mask layer 84 is formed on the oxide film 53c of the lower surface 20d side of the semiconductor region 20 by CVD and etch-back. Next, the oxide film 53c exposed from the mask layer 84 is selectively removed by wet etching using a hydrofluoric acid-based solution. Thus, part of the side surface 21sw of the trench 21t is exposed.

Thus, the following process is repeated in the second embodiment. The process includes the step of removing part of the stacked structure on the upper surface 20u side of the oxide film exposed from the mask layer. The process further includes the step of removing the nitride film that was in contact with the removed oxide film, thereby exposing the oxide film below the removed nitride film.

Subsequently, the gate insulating film 52 shown in FIG. 11 is formed on the side surface 21sw of the trench 21t by CVD or thermal oxidation technique. Here, the gate insulating film 52 and the processed stacked film are collectively referred to as insulating film 54. In the stacked film, the oxide film 53c, the nitride film 53bb, the oxide film 53ba, the nitride film 53ab, and the oxide film 53aa are stacked in this order.

Subsequently, as in the first embodiment, a conductive layer 58 is formed via the insulating film 54 in the trench 21t by CVD. The conductive layer 58 is formed via the insulating film 54 also on the semiconductor region 20. The conductive layer 58 includes e.g. polysilicon.

Thus, in the trench 21t, a gate electrode 50 is formed via the gate insulating film 52. Furthermore, a field plate electrode 51 is formed via the processed stacked film below the gate electrode 50.

In the case of forming the semiconductor device 2B, etch-back is performed so that the surface of the conductive layer 58 is located below the lower end of the gate insulating film 52. An insulating film 56 is formed on the etched-back conductive layer 58. A conductive layer 58 is formed again on the insulating film 56.

Subsequently, as shown in FIG. 11, a p-type impurity element is implanted on the semiconductor region 20. Thus, a base region 30 is selectively formed on the semiconductor region 20. Next, an n-type impurity element is implanted on the base region 30. Thus, a source region 40 is selectively formed on the base region 30. Furthermore, as shown in FIG. 11, an interlayer insulating film 55 is formed on each of part of the source region 40, the gate electrode 50, and the gate insulating film 52. Next, a source electrode 11 electrically connected to the source region 40 is formed via a connection region 11c on the source region 40. Furthermore, a drain electrode 10 electrically connected to the semiconductor region 20 is formed below the semiconductor region 20.

Third Embodiment

FIGS. 21A to 22B are schematic sectional views showing a method for manufacturing the substantial part of a semiconductor device according to a third embodiment.

The method for forming a plurality of step differences in the field plate insulating film 53 is not limited to the first and second embodiments. The following method may also be used.

Figure 21A:
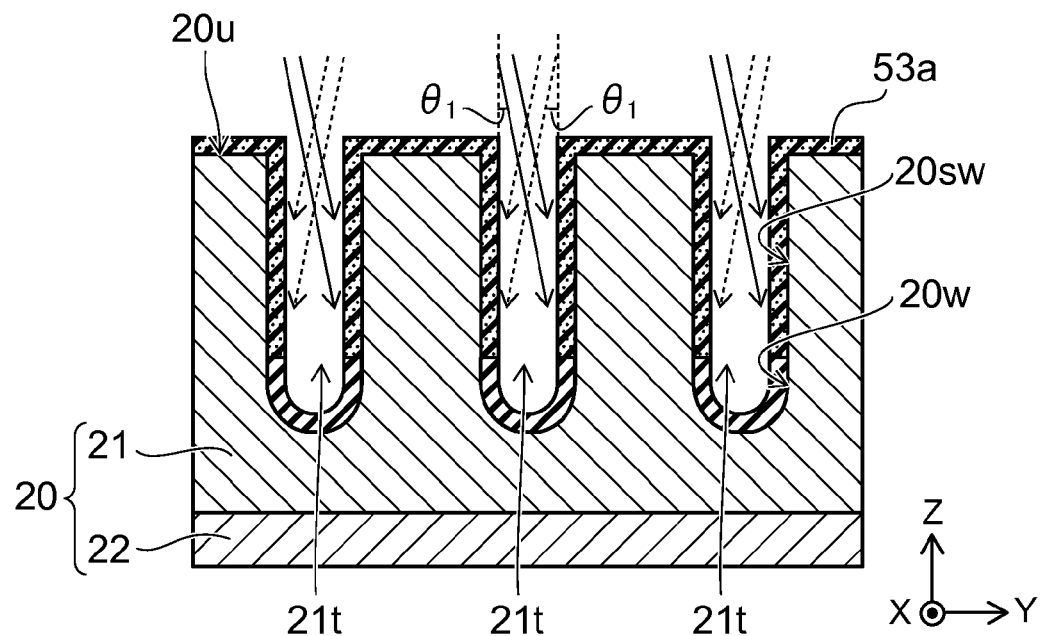
FIGS. 21A to 22B are schematic sectional views showing a method for manufacturing the substantial part of a semiconductor device according to a third embodiment.

For instance, as shown in FIG. 21A, an insulating film 53a is formed on the inner wall 21w of the trench 21t and the upper surface 20u of the semiconductor region 20 by CVD or thermal oxidation technique. Next, part of the insulating film 53a formed on the inner wall 21w of the trench 21t on the upper surface 20u side of the semiconductor region 20 is doped with an impurity element by ion implantation. The impurity element is at least one element selected from e.g. boron (B), phosphorus (P), arsenic (As), silicon (Si), and germanium (Ge).

Here, the acceleration voltage of the impurity element is adjusted so that the impurity element does not reach the semiconductor region 20. The inclination angle of the impurity element from the direction (Z-axis) perpendicular to the upper surface 20u of the semiconductor region 20 is set to $\theta_1$ ($0°<\theta_1<90°$) (solid lines in FIG. 21A). The depth of the impurity element doped from the upper surface 20u side of the semiconductor region 20 is controlled by adjusting the inclination angle of the impurity element.

The semiconductor region 20 can be rotated about the Z-axis. After rotating the semiconductor region 20 by 180° about the Z-axis, ion implantation is performed again on the insulating film 53a under the same condition (dashed lines in FIG. 21A). Thus, both the insulating films 53a opposed in the trench 21t are doped with the impurity element.

Figure 21B:
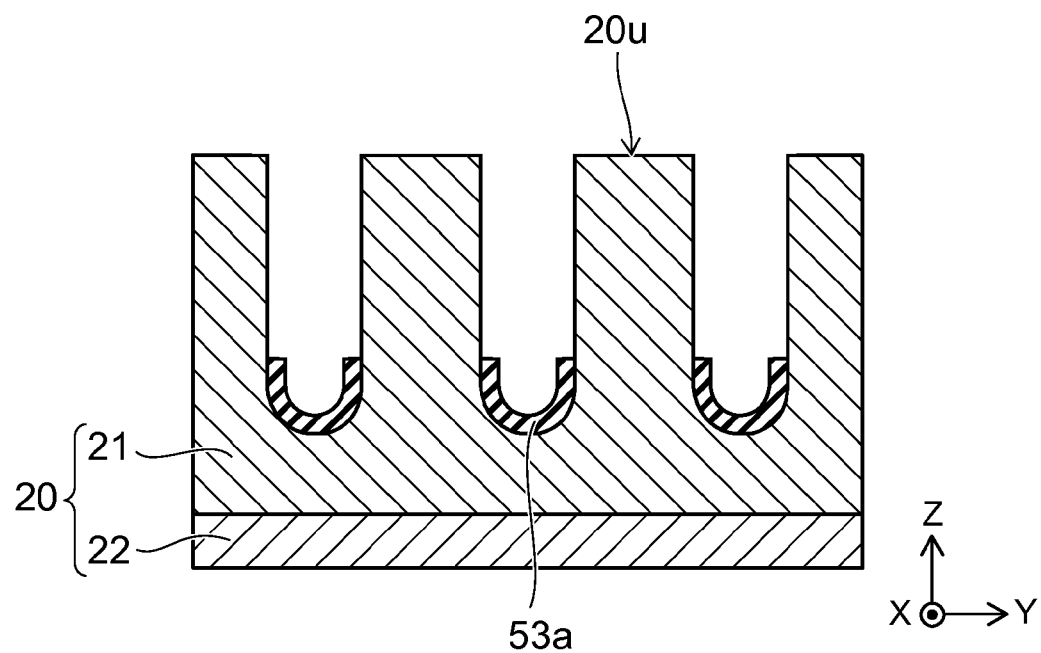

Next, as shown in FIG. 21B, the insulating film 53a is exposed to an etching liquid. The etching liquid is e.g. a hydrofluoric acid-based solution. Here, the etching rate of the insulating film 53a doped with the impurity element is faster than the etching rate of the insulating film 53a not doped with the impurity element. Thus, the portion of the insulating film 53a doped with the impurity element, i.e., part of the insulating film 53a on the upper surface 20u side of the semiconductor region 20, is selectively removed.

Figure 22A:
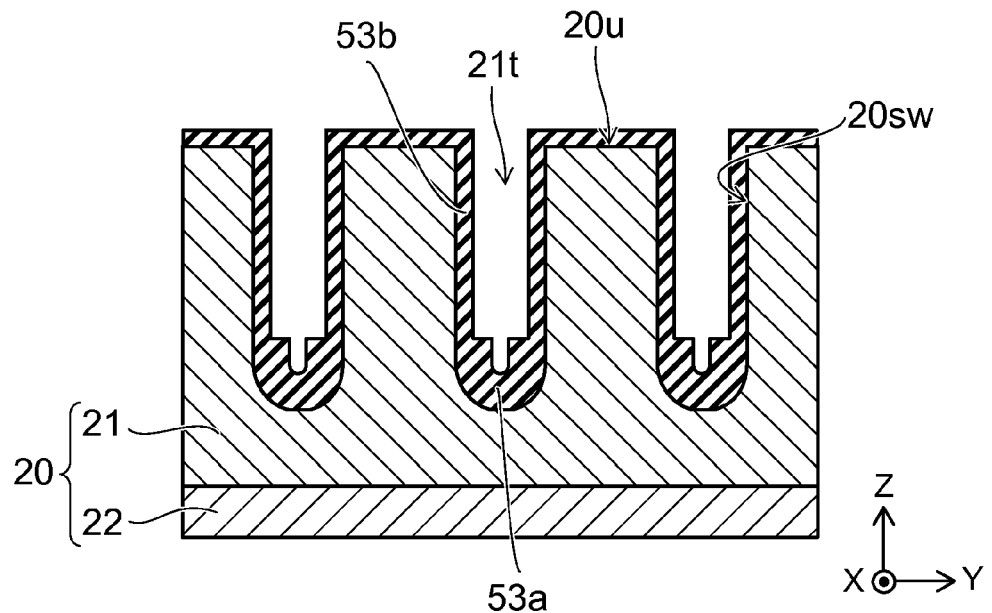

Next, as shown in FIG. 22A, an insulating film 53b is formed on the inner wall 21w of the trench 21t and the upper surface 20u of the semiconductor region 20 by CVD or thermal oxidation technique. The insulating film 53b includes e.g. silicon oxide.

Here, on the insulating film 53a, the insulating film 53b of the same ingredient is formed. The insulating film 53b on the insulating film 53a is integrated with the insulating film 53a. Thus, the film thickness of the insulating film 53a is made thicker than that of the insulating film 53b. Accordingly, a step difference occurs between the insulating film 53b and the insulating film 53a.

Figure 22B:
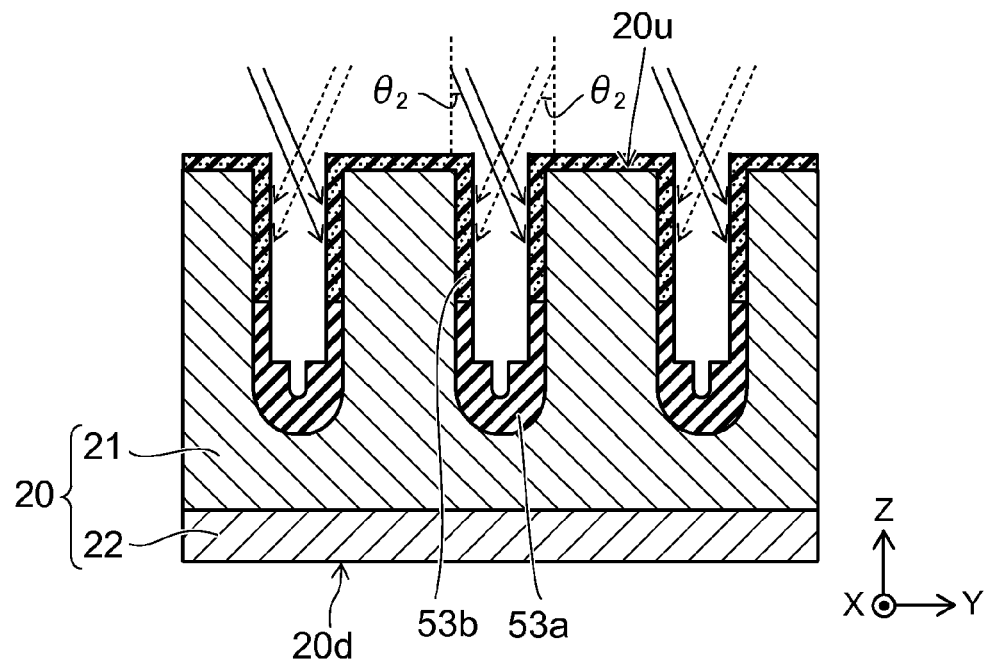

Next, as shown in FIG. 22B, part of the insulating film 53b formed on the side surface 21sw of the trench 21t on the upper surface 20u side of the semiconductor region 20 is doped with an impurity element by ion implantation. The impurity element is at least one element selected from e.g. boron (B), phosphorus (P), arsenic (As), silicon (Si), and germanium (Ge).

Here, the acceleration voltage of the impurity element is adjusted so that the impurity element does not reach the semiconductor region 20. The inclination angle of the impurity element from the direction (Z-axis) perpendicular to the upper surface 20u of the semiconductor region 20 is set to $\theta_2$ ($0°<\theta_2<90°$) (solid lines in FIG. 22B). The depth of the impurity element doped from the upper surface 20u side of the semiconductor region 20 is controlled by adjusting the inclination angle of the impurity element.

The semiconductor region 20 can be rotated about the Z-axis. After rotating the semiconductor region 20 by 180° about the Z-axis, ion implantation is performed again under the same condition (dashed lines in FIG. 22B). Thus, both the insulating films 53b opposed in the trench 21t are doped with the impurity element.

At this stage, the inclination angle $\theta_2$ is controlled so as to be larger than the inclination angle $\theta_1$. Thus, part of the insulating film 53b on the upper surface 20u side of the semiconductor region 20 is selectively doped with the impurity element.

Subsequently, the insulating film 53a, 53b is exposed to an etching liquid. The etching liquid is e.g. a hydrofluoric acid-based solution. Here, the etching rate of the insulating film 53b doped with the impurity element is faster than the etching rate of the insulating film 53a, 53b not doped with the impurity element. Thus, the portion of the insulating film 53b doped with the impurity element, i.e., part of the insulating film 53b on the upper surface 20u side of the semiconductor region 20, is selectively removed.

Subsequently, a plurality of step differences are formed in the field plate insulating film 53 by repeating ion implantation into the insulating film with a larger inclination angle and etching of the insulating film with a hydrofluoric acid-based solution. The method as described above can also form a plurality of step differences in the field plate insulating film 53.

Fourth Embodiment

Figure 23A:
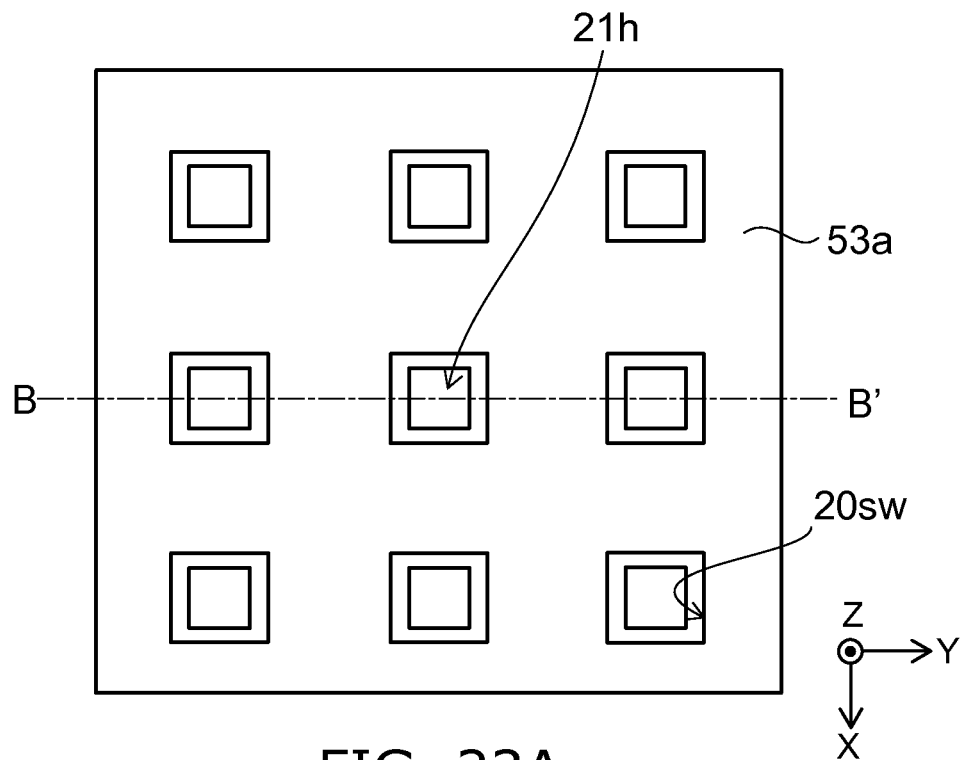
FIG. 23A is a schematic plan view showing a method for manufacturing the substantial part of a semiconductor device according to a fourth embodiment.
Figure 23B:
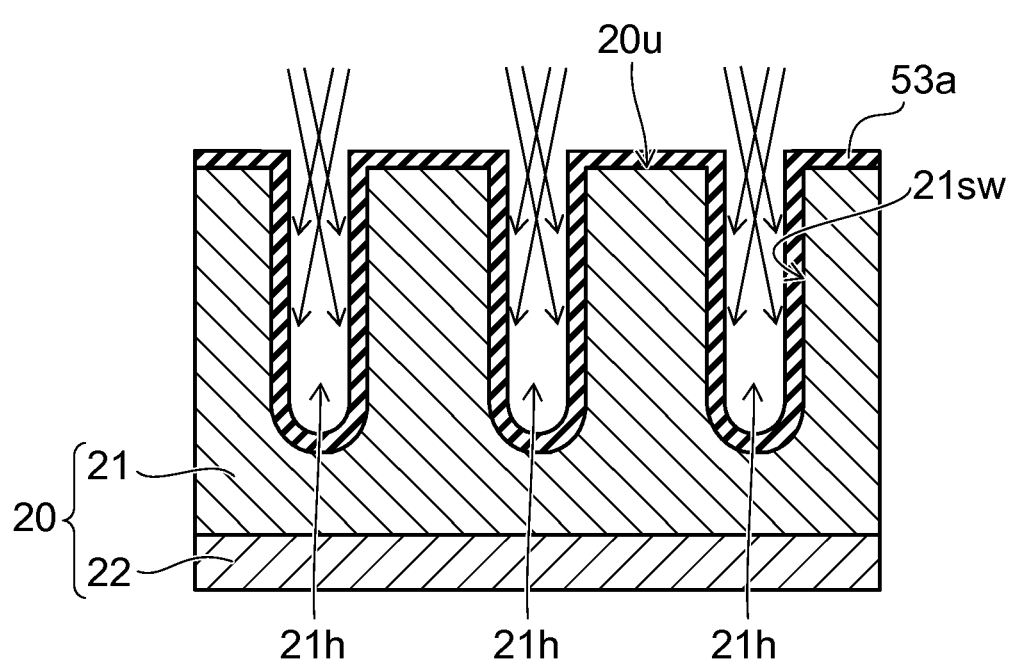
FIG. 23B is a schematic sectional view showing the method for manufacturing the substantial part of a semiconductor device according to the fourth embodiment.

FIG. 23A is a schematic plan view showing a method for manufacturing the substantial part of a semiconductor device according to a fourth embodiment. FIG. 23B is a schematic sectional view showing the method for manufacturing the substantial part of a semiconductor device according to the fourth embodiment.

Here, FIG. 23B shows a schematic cross section taken along line B-B' of FIG. 23A.

In the fourth embodiment, instead of the trench 21, a hole 21h is formed as an aperture for forming a gate electrode 50, a gate insulating film 52, a field plate electrode 51, and a field plate insulating film 53 in the semiconductor region 20. The hole 21h is provided like a dot in the XY-plane (FIG. 23A). The planar shape of the hole 21h is rectangular. As an example, FIG. 23A shows the state in which an insulating film 53a is provided in the hole 21h and on the upper surface 20u of the semiconductor region 20.

A gate electrode 50 is provided in a plurality of such holes 21h. This further increases the channel density and reduces the on-resistance.

In the case of forming a step difference in the insulating film 53a provided in the hole 21h, ion implantation technique as in the third embodiment is used. In this case, the semiconductor region 20 is rotated by 0°, 90°, 180°, and 270° about the Z-axis. The insulating film 53a is subjected to ion implantation under the same condition at each rotation angle.

Thus, an impurity element is selectively implanted into part of the insulating film 53a formed on the side surface 21sw of the hole 21h on the upper surface 20u side of the semiconductor region 20. Then, the insulating film 53a is exposed to a hydrofluoric acid-based solution. Thus, part of the insulating film 53a on the upper surface 20u side of the semiconductor region 20 is selectively removed.

Fifth Embodiment

FIGS. 24A to 27B are schematic sectional views showing a method for manufacturing the substantial part of a semiconductor device according to a fifth embodiment.

Figure 24A:
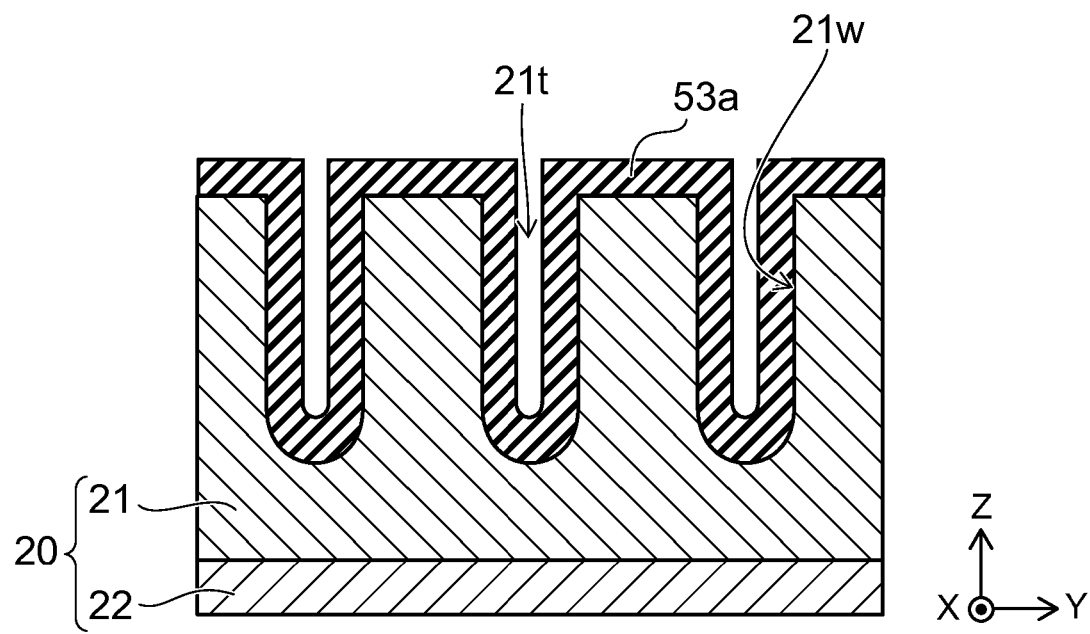
FIGS. 24A to 27B are schematic sectional views showing a method for manufacturing the substantial part of a semiconductor device according to a fifth embodiment.

The method for forming a plurality of step differences in the field plate insulating film 53 may be the following method. For instance, as shown in FIG. 24A, an insulating film 53a is formed on the inner wall 21w of the trench 21t provided in the semiconductor region 20 or on the semiconductor region 20 by CVD or thermal oxidation technique.

Figure 24B:
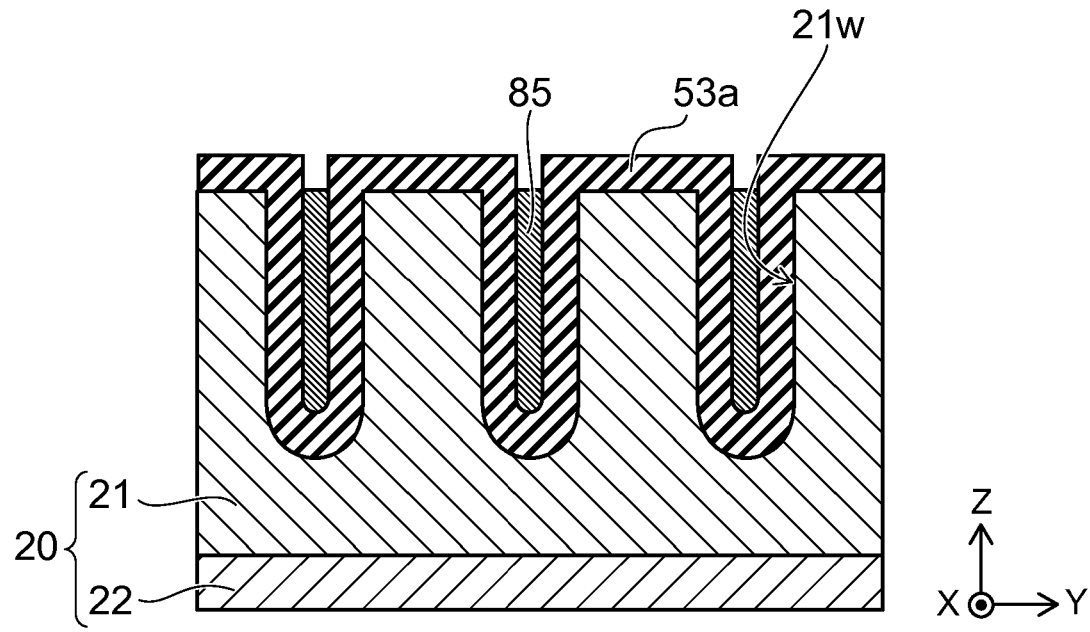

Next, as shown in FIG. 24B, a mask layer 85 is formed via the insulating film 53a in the trench 21t. The mask layer 85 includes resist. Subsequently, the insulating film 53a is exposed to e.g. a hydrofluoric acid-based solution.

Figure 25A:
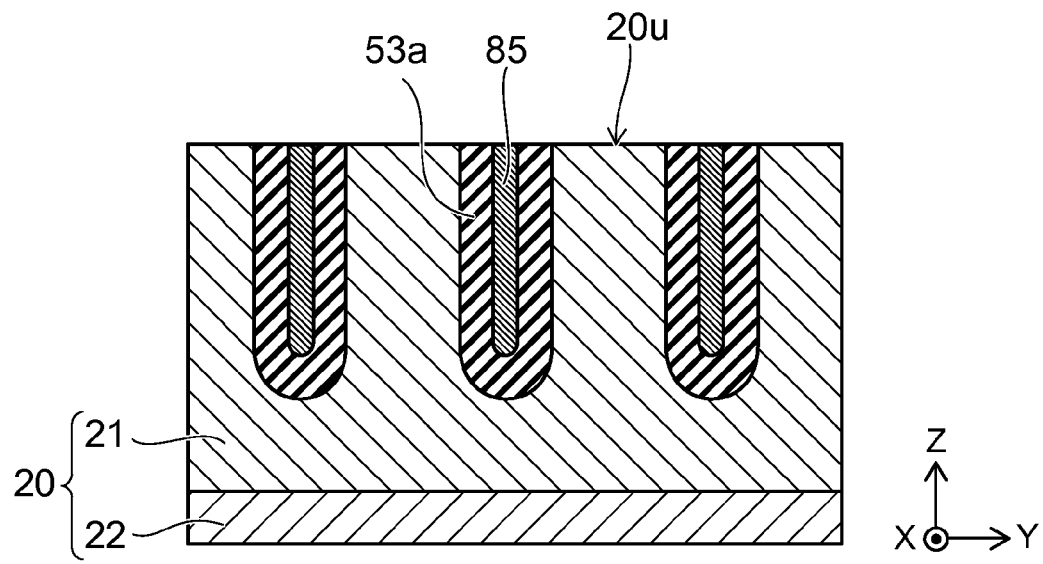

Thus, as shown in FIG. 25A, the insulating film 53a above the upper surface 20u of the semiconductor region 20 is removed.

Figure 25B:
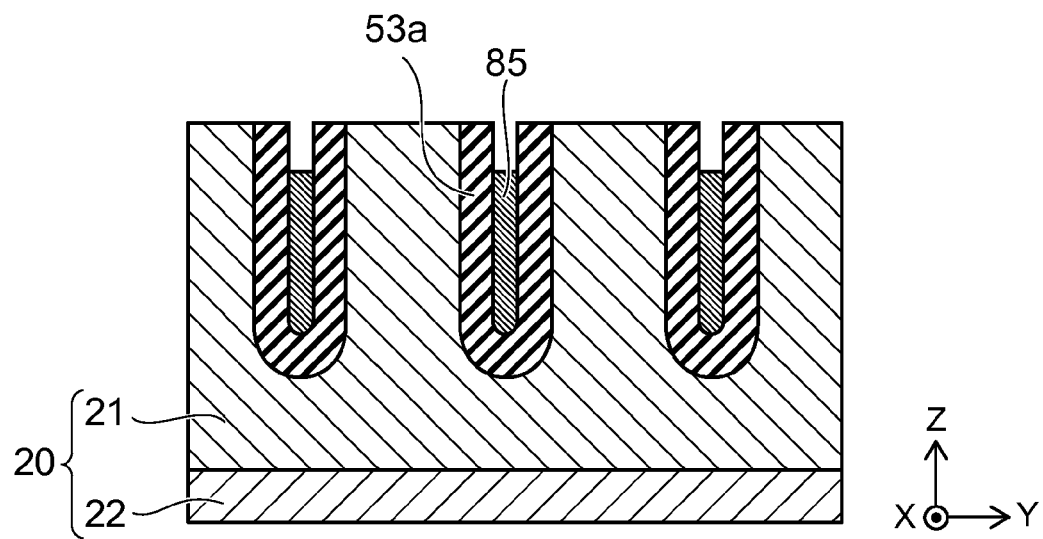

Next, as shown in FIG. 25B, the mask layer 85 is subjected to etch-back.

Figure 26A:
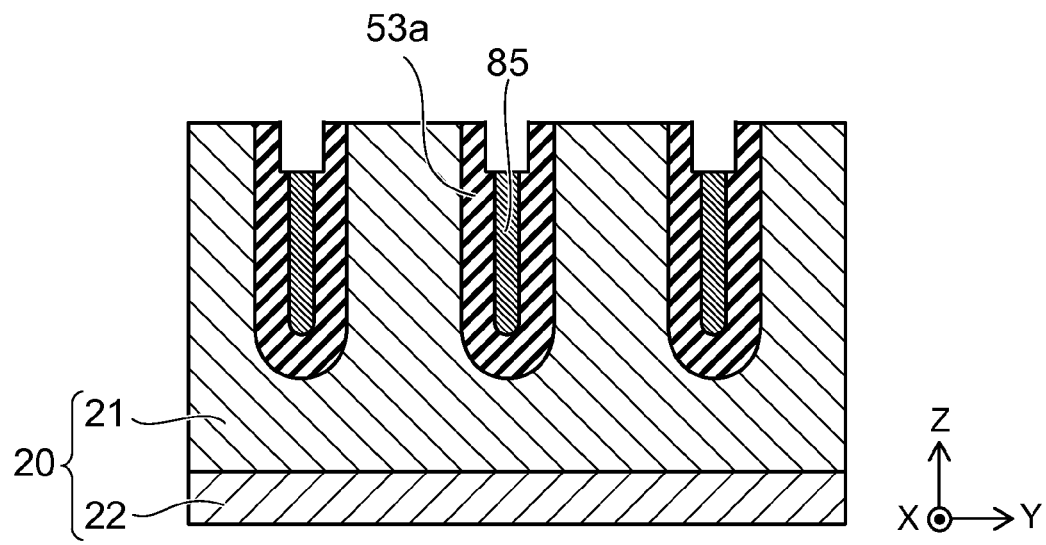

Next, as shown in FIG. 26A, the insulating film 53a exposed from the mask layer 85 is exposed to e.g. a hydrofluoric acid-based solution. Thus, part of the surface of the insulating film 53a exposed from the mask layer 85 is removed. This decreases the film thickness of the insulating film 53a exposed from the mask layer 85. That is, at this stage, the etching time is adjusted so that the insulating film 53a exposed from the mask layer 85 is not completely removed, but an insulating film 53a having a prescribed thickness remains in the trench 21t.

Figure 26B:
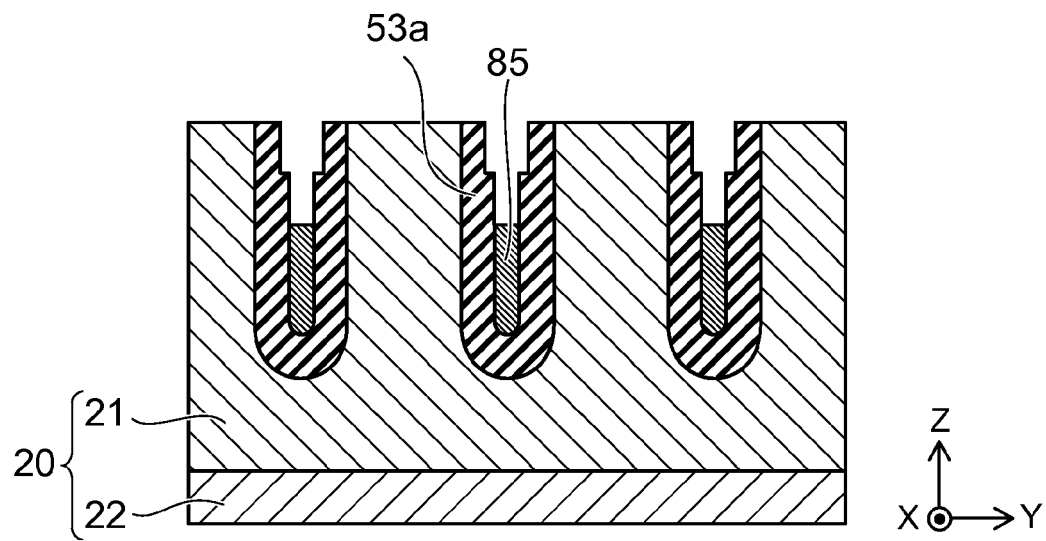

Next, as shown in FIG. 26B, the mask layer 85 is subjected to etch-back.

Figure 27A:
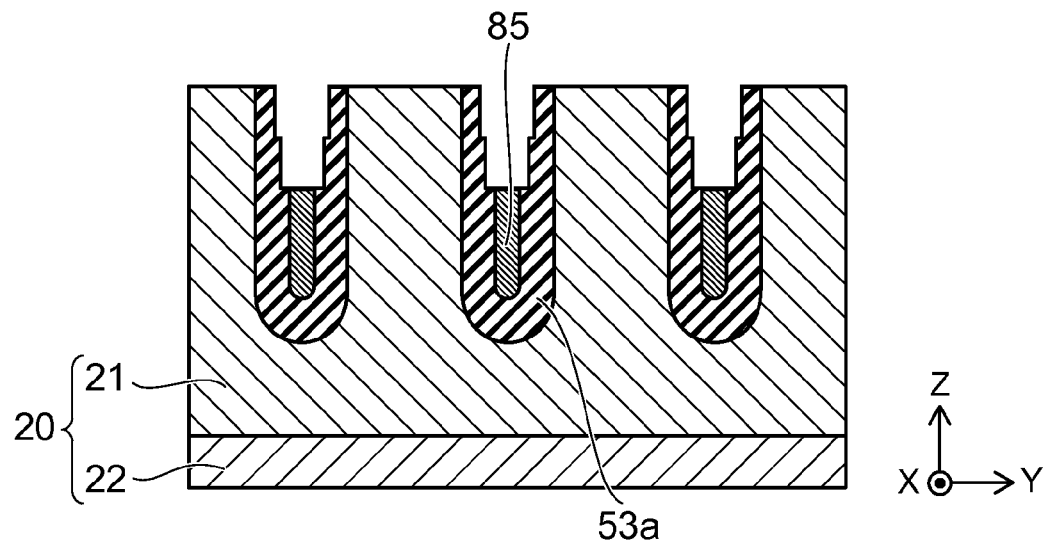

Next, as shown in FIG. 27A, the insulating film 53a exposed from the mask layer 85 is exposed to an etchant of the insulating film 53a. The etchant of the insulating film 53a is e.g. a hydrofluoric acid-based solution. Thus, part of the surface of the insulating film 53a exposed from the mask layer 85 is removed.

Here, the portion of the insulating film 53a with the film thickness thinned at the stage of FIG. 26A is further thinned in film thickness by exposure to the hydrofluoric acid-based solution. Thus, a step difference occurs in the insulating film 53a.

Figure 27B:
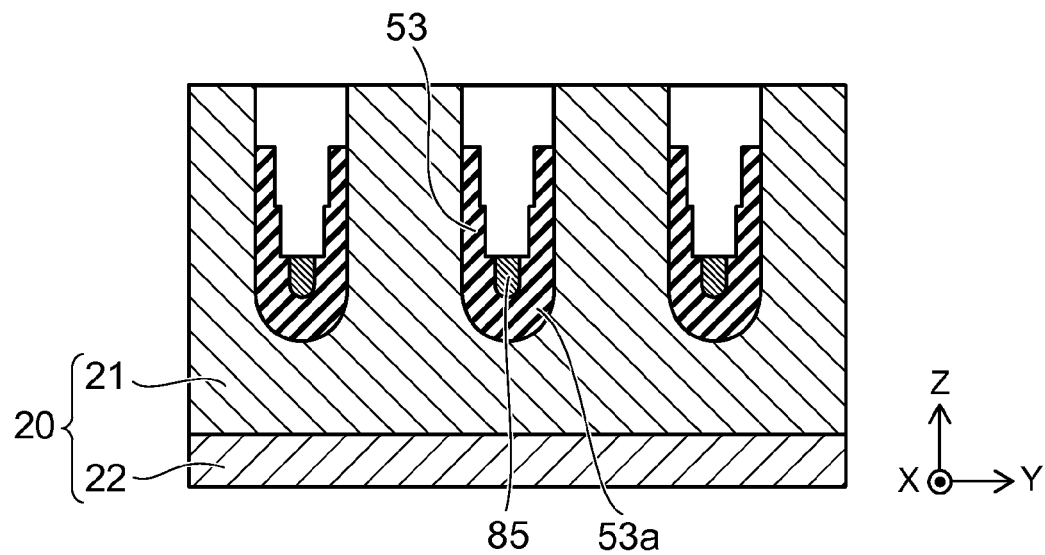

Next, a field plate insulating film 53 having three or more film thicknesses is formed by repeating etch-back of the mask layer 85 and etching of the insulating film 53a described above. This state is shown in FIG. 27B.

Subsequently, for instance, a gate insulating film 52 is formed in the trench 21t. Then, in the trench 21t, a gate electrode 50 is formed via the gate insulating film 52. Furthermore, a field plate electrode 51 is formed via the field plate insulating film 53 below the gate electrode 50.

Thus, in the fifth embodiment, an insulating film 53a is previously formed on the inner wall 21w of the trench 21t. Next, a mask layer 85 is formed via the insulating film 53a on the inner wall 21w of the trench 21t. Then, etch-back is performed a plurality of times on the mask layer 85. The insulating film 53a is exposed to the etchant of the insulating film 53a after each etch-back. Thus, the insulating film 53a is selectively etched after each etch-back of the mask layer 85. Accordingly, a field plate insulating film 53 having a plurality of film thicknesses, i.e., a plurality of step differences, is formed.

In each of the aforementioned semiconductor devices, a $p^+$-type collector region may be provided between the drain electrode 10 and the drain region 22. Thus, the semiconductor device may be configured as an IGBT. In this case, "source" should be read as "emitter", "drift" as "base", and "drain" as "collector".

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a first semiconductor region of a first conductivity type;
   a second semiconductor region of a second conductivity type selectively provided on the first semiconductor region;
   a third semiconductor region of the first conductivity type selectively provided on the second semiconductor region;
   a first electrode provided via a first insulating film on the third semiconductor region, the first electrode electrically being connected to the third semiconductor region;
   a second electrode electrically connected to the first semiconductor region;
   a third electrode provide via a second insulating film on the first semiconductor region, the second semiconductor region, and the third semiconductor region; and
   a fourth electrode provided on the second electrode side of the third electrode, the fourth electrode being provided via a third insulating film on the first semiconductor region, and the fourth electrode being in contact with the third electrode,
   the second insulating film and the third insulating film surrounding the third electrode and the fourth electrode,
   the third insulating film having three or more regions between the fourth electrode and the first semiconductor region, width of each of the regions in a direction crossing a direction from the third electrode toward the second electrode being different,
   the third insulating film between the fourth electrode and the first semiconductor region being thinned stepwise in a direction from the second electrode toward the third electrode,
   the third insulating film being located below a p-n junction between the first semiconductor region and the second semiconductor region,
   a thickness of the third insulating film being thicker than a thickness of the second insulating film, and
   the third insulating film including nitride films stacked toward a lower direction on the basis of the p-n junction.

2. The device according to claim 1, wherein width of the fourth electrode is narrower than width of the third electrode.

3. The device according to claim 1, wherein a distance between the forth electrode and the first semiconductor region is changed stepwise.

4. The device according to claim 1, wherein the third insulating film in contact with the fourth electrode includes a plurality of materials.

5. A semiconductor device comprising:
   a first semiconductor region of a first conductivity type;
   a second semiconductor region of a second conductivity type selectively provided on the first semiconductor region;
   a third semiconductor region of the first conductivity type selectively provided on the second semiconductor region;
   a first electrode provided via a first insulating film on the third semiconductor region, the first electrode electrically being connected to the third semiconductor region;
   a second electrode electrically connected to the first semiconductor region;
   a third electrode provide via a second insulating film on the first semiconductor region, the second semiconductor region, and the third semiconductor region;
   a fourth electrode provided on the second electrode side of the third electrode, the fourth electrode being provided via a third insulating film on the first semiconductor region; and
   a fourth insulating film provided between the fourth electrode and the third electrode,
   the second insulating film and the third insulating film surrounding the third electrode and the fourth electrode,
   the third insulating film having three or more regions between the fourth electrode and the first semiconductor region, width of each of the regions in a direction crossing a direction from the third electrode toward the second electrode being different,
   the third insulating film between the fourth electrode and the first semiconductor region being thinned stepwise in a direction from the second electrode toward the third electrode,
   the third insulating film being located below a p-n junction between the first semiconductor region and the second semiconductor region,
   a thickness of the third insulating film being thicker than a thickness of the second insulating film,
   the third insulating film including nitride films stacked toward a lower direction on the basis of the p-n junction.

* * * * *